United States Patent
Toyoshima et al.

(10) Patent No.: US 10,656,468 B2
(45) Date of Patent: May 19, 2020

(54) DISPLAY DEVICE WITH A CAPACITIVE TOUCH PANEL

(71) Applicant: ZEON CORPORATION, Tokyo (JP)

(72) Inventors: Tetsuya Toyoshima, Tokyo (JP); Shunsuke Yamanaka, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 16/241,483

(22) Filed: Jan. 7, 2019

(65) Prior Publication Data

US 2019/0171051 A1 Jun. 6, 2019

Related U.S. Application Data

(62) Division of application No. 15/824,429, filed on Nov. 28, 2017, now Pat. No. 10,209,567, which is a
(Continued)

(51) Int. Cl.
*G02F 1/13363* (2006.01)
*H01L 27/32* (2006.01)
(Continued)

(52) U.S. Cl.
CPC ...... *G02F 1/13363* (2013.01); *G02F 1/13338* (2013.01); *G06F 3/044* (2013.01);
(Continued)

(58) Field of Classification Search
CPC ............ G02F 1/13363; G02F 1/13338; G02F 1/133528; G02F 2001/133562;
(Continued)

(56) References Cited

U.S. PATENT DOCUMENTS

| 8,379,169 B2 | 2/2013 | Kitagawa et al. |
| 9,720,534 B2 * | 8/2017 | Pi .................... G02F 1/13338 |

(Continued)

FOREIGN PATENT DOCUMENTS

| JP | S50-83482 A | 7/1975 |
| JP | H02-113920 A | 4/1990 |

(Continued)

OTHER PUBLICATIONS

Jun. 3, 2014 International Search Report issued in International Patent Application No. PCT/JP2014/002055.
(Continued)

*Primary Examiner* — Huyen L Ngo
(74) *Attorney, Agent, or Firm* — Oliff PLC

(57) ABSTRACT

Disclosed is a display device with a capacitive touch panel including a laminate between a display panel and a cover layer, the laminate having a viewing-side polarizing plate; a first conductive layer, a dielectric layer and a second conductive layer constituting a capacitive touch sensor; and a substrate, in which the first conductive layer, dielectric layer, second conductive layer, and substrate are positioned closer to the cover layer than is the viewing-side polarizing plate, the first conductive layer is formed on one surface of the to substrate, the dielectric layer is formed on a surface of the first conductive layer opposite to the substrate side, the second conductive layer is formed on a surface of the dielectric layer opposite to the first conductive layer side, the substrate has an optical film with a phase difference of $(2n-1)\lambda/4$, where n is a positive integer, the viewing-side polarizing plate has a polarizing film, and a slow axis of the optical film intersects a transmission axis of the polarizing film at an angle of about 45° as viewed in a stacking direction.

3 Claims, 7 Drawing Sheets

Related U.S. Application Data division of application No. 14/891,075, filed as application No. PCT/JP2014/002055 on Apr. 9, 2014, now Pat. No. 9,857,633.

(51) Int. Cl.
| | |
|---|---|
| *H01L 51/50* | (2006.01) |
| *G02F 1/1333* | (2006.01) |
| *G06F 3/041* | (2006.01) |
| *G06F 3/044* | (2006.01) |
| *G09G 3/3208* | (2016.01) |
| *H01L 51/52* | (2006.01) |
| *G02F 1/1335* | (2006.01) |
| *G02B 5/30* | (2006.01) |

(52) U.S. Cl.
CPC ......... *G06F 3/0412* (2013.01); *G09G 3/3208* (2013.01); *H01L 27/323* (2013.01); *H01L 51/50* (2013.01); *H01L 51/5237* (2013.01); *G02B 5/3025* (2013.01); *G02F 1/133528* (2013.01); *G02F 2001/133562* (2013.01); *G02F 2001/133635* (2013.01); *G02F 2001/133638* (2013.01); *G02F 2413/01* (2013.01); *G02F 2413/08* (2013.01); *H01L 51/5281* (2013.01)

(58) Field of Classification Search
CPC ........ G02F 2001/133635; G02F 2001/133638; G02F 2413/01; G02F 2413/08; G06F 3/0412; G06F 3/044; G09G 3/3208; H01L 51/5237; H01L 27/323; H01L 51/50; H01L 51/5281; G02B 5/3025
See application file for complete search history.

(56) References Cited

U.S. PATENT DOCUMENTS

| | | | |
|---|---|---|---|
| 10,025,432 B2* | 7/2018 | Kishioka | .................. B32B 7/12 |
| 2002/0008840 A1 | 1/2002 | Sakamaki et al. | |
| 2006/0177607 A1 | 8/2006 | Ohmori et al. | |
| 2008/0291386 A1* | 11/2008 | Dunn | ................ G02F 1/133382 349/161 |
| 2009/0303202 A1 | 12/2009 | Liu et al. | |
| 2009/0315840 A1 | 12/2009 | Park et al. | |
| 2012/0055607 A1 | 3/2012 | Kitagawa et al. | |
| 2012/0056211 A1 | 3/2012 | Kitagawa et al. | |
| 2013/0016047 A1 | 1/2013 | Masumoto | |
| 2013/0258570 A1 | 10/2013 | Nashiki et al. | |
| 2015/0029412 A1 | 1/2015 | Kishioka et al. | |
| 2015/0362776 A1* | 12/2015 | Jikumaru | ............ G02F 1/13394 349/12 |
| 2018/0145095 A1 | 5/2018 | Yamazaki et al. | |
| 2018/0275808 A1 | 9/2018 | Lee et al. | |

FOREIGN PATENT DOCUMENTS

| | | |
|---|---|---|
| JP | H03-182701 A | 8/1991 |
| JP | 2000-009912 A | 1/2000 |
| JP | 2002-022944 A | 1/2002 |
| JP | 2002-086554 A | 3/2002 |
| JP | 2002-311239 A | 10/2002 |
| JP | 2003-131233 A | 5/2003 |
| JP | 2009-169837 A | 7/2009 |
| JP | 2009-283349 A | 12/2009 |
| JP | 2010-039458 A | 2/2010 |
| JP | 2012-133313 A | 7/2012 |
| JP | 2013-003952 A | 1/2013 |
| JP | 2013-041566 A | 2/2013 |
| TW | 200700846 A | 1/2007 |
| TW | 201241719 A | 10/2012 |
| WO | 2012/073964 A1 | 6/2012 |

OTHER PUBLICATIONS

Nov. 17, 2015 International Preliminary Report on Patentability issued in International Patent Application No. PCT/JP2014/002055.

* cited by examiner

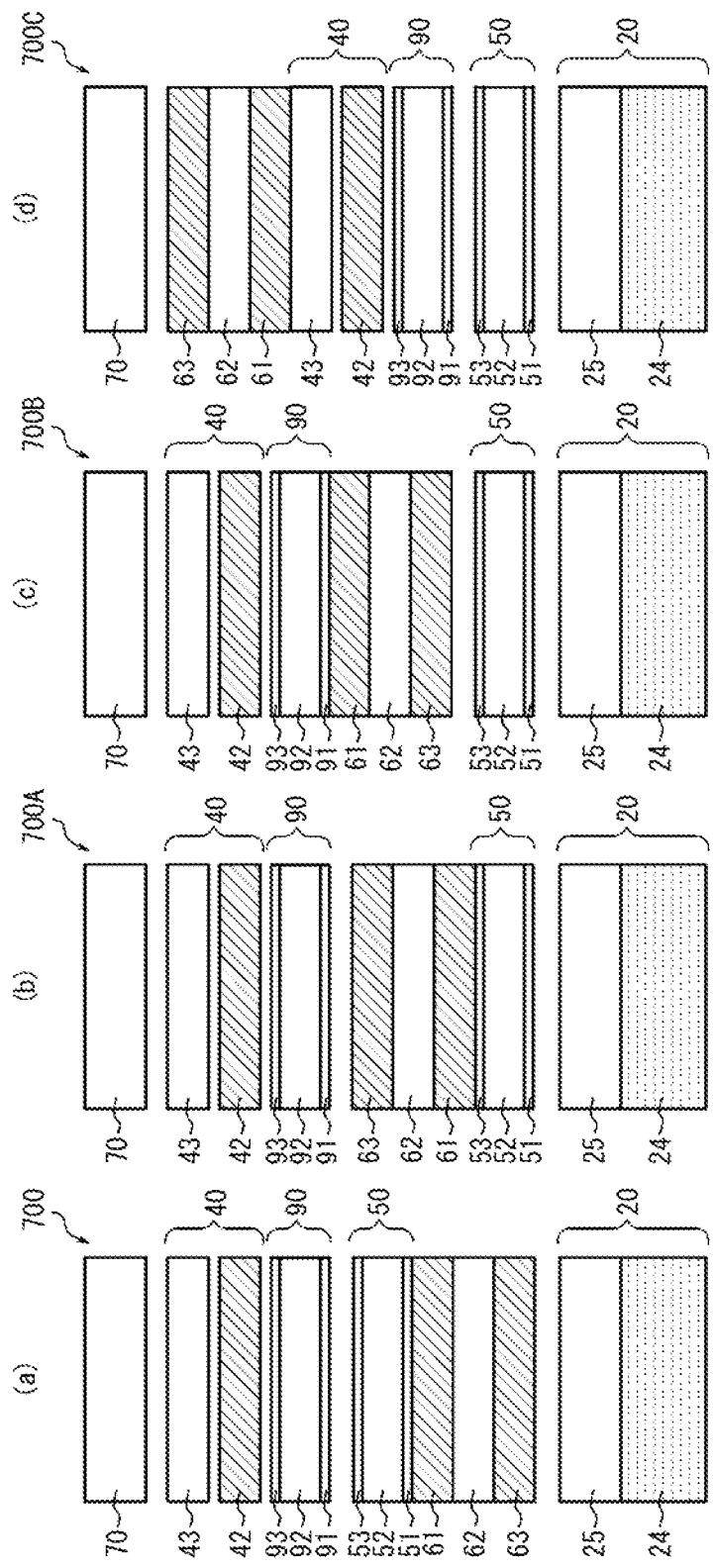

DISPLAY DEVICE WITH A CAPACITIVE TOUCH PANEL

This is a divisional application of U.S. application Ser. No. 15/824,429 filed Nov. 28, 2017, which in turn is a divisional application of U.S. application Ser. No. 14/891,075 filed Nov. 13, 2015, which in turn is a U.S. national stage application of PCT/JP2014/002055 filed Apr. 9, 2014. The entire disclosures of the prior applications are hereby incorporated by reference herein in their entirety.

TECHNICAL FIELD

This disclosure relates to a display device with a touch panel, in particular to a display device with a capacitive touch panel.

BACKGROUND

As displays combined with input means, display devices with touch panels are widely used in electronics, such as laptop computers, OA equipment, medical equipment, car navigation devices, portable electronic devices such as mobile phones, and personal digital assistants (PDAs). Here, different types of touch panels are known, including capacitive type, optical type, ultrasonic type, electromagnetic induction type, resistance film type, and the like. Among these, in particular, capacitive type, which detects input coordinates by monitoring changes in the electrostatic capacity between a finger tip and a conductive layer, is becoming the mainstream of current touch panels, on par with resistance film type.

As a conventional display device with a capacitive touch panel, for example, a liquid crystal display device is known to have: a backlight-side polarizing plate; a liquid crystal panel formed with a liquid crystal layer sandwiched between two glass base plates (a thin film transistor base plate and a color filter base plate); a viewing-side polarizing plate; a touch sensor unit; and a cover glass layer, which are stacked in the stated order from the backlight side towards the viewing side. Additionally, the above conventional liquid crystal display device with a capacitive touch panel may have a phase difference film for viewing angle compensation provided between the liquid crystal panel and the viewing-side polarizing plate.

In addition, a conventional liquid crystal display device with a touch panel proposes providing a quarter wavelength plate between a viewing-side polarizing plate and a cover glass layer such that linearly polarized light traveling from the liquid crystal panel side through the viewing-side polarizing plate towards the cover glass layer side is converted by the quarter wavelength plate into circularly polarized light or elliptically polarized light (see, for example, JP2009-169837A (PTL 1)). In this way, when a liquid crystal display device with a touch panel is operated by an individual wearing polarized sunglasses, the displayed content can be visually recognized even under the condition of so-called crossed nicols, in which a transmission axis of the viewing-side polarizing plate and a transmission axis of the polarized sunglasses are set orthogonal to each other.

Moreover, as another conventional display device with a capacitive touch panel, an organic EL display device is known to have: a display panel formed by an organic EL display (OLED) panel and a barrier glass layer which is positioned closer to the viewing side than is the OLED panel; an anti-reflective circularly polarizing plate formed by a quarter wavelength plate and a polarizing plate which is positioned closer to the viewing side than is the quarter wavelength plate; a touch sensor unit; and a cover glass layer, which are stacked in the stated order from the display panel side (light emitting side) towards the viewing side (see, for example, JP2013-41566A (PTL 2)). Such an organic EL display device can prevent incident external light (natural light) being reflected at the surface of the OLED panel (particularly the surface of an electrode in the OLED panel) from making visual recognition of the displayed content difficult.

Additionally, any of the above conventional display devices with capacitive touch panels has a touch sensor unit that is formed with, for example, two transparent base plates, each having a conductive layer formed on a surface thereof, stacked together such that the conductive layer of one transparent base plate face a surface of the other transparent base plate on the side opposite where the conductive layer of the other transparent base plate is formed (see, for example, JP2013-3952A (PTL 3)).

CITATION LIST

Patent Literature

PTL 1: JP2009-169837A
PTL 2: JP2013-41566A
PTL 3: JP2013-3952A

SUMMARY

Technical Problem

Recently, there is increasing demand for further reduction in the thickness and weight of display devices with capacitive touch panels. However, the above conventional display devices with capacitive touch panels have the problem that since a touch sensor unit is formed with two transparent base plates, each having a conductive layer formed on a surface thereof, the thickness between the liquid crystal panel or OLED panel and the cover glass layer increases, which results in an increase in the thickness of the entire device.

The problem of increased thickness between the liquid crystal panel or OLED panel and the cover glass layer becomes more pronounced, particularly in the case of many members being present between the liquid crystal panel or OLED panel and the cover glass layer, such as where, as described above, a phase difference film for viewing angle compensation is provided, a quarter wavelength plate is provided to enable the operator to operate the display device with a tough panel through polarized sunglasses, an anti-reflective circularly polarizing plate is provided, and so on.

Therefore, a first object of the disclosure is to provide a display device with a capacitive touch panel that is reduced in thickness.

In addition, a second object of the disclosure is to provide a display device with a capacitive touch panel that can be operated by the operator even through polarized sunglasses and is reduced in thickness.

Moreover, a third object of the disclosure is to provide a display device with a capacitive touch panel that can prevent reflected light of incident external light from making visual recognition of the displayed content difficult, and that is reduced in thickness.

Solution to Problem

To solve the above problem, intense study was made and the study gave an idea of forming a touch sensor, including two conductive layers and a dielectric layer positioned between the conductive layers, on one surface of an optical member (for example, a phase difference film, a quarter wavelength plate, an anti-reflective circularly polarizing plate, or the like) used in a display device with a capacitive touch panel to eliminate the need for transparent base plates for forming the conductive layers, thereby reducing the thickness of the display device with a capacitive touch panel. The disclosure was made based on this idea.

That is, to solve the aforementioned problem advantageously, according to a first aspect of the disclosure, there is provided a display device with a capacitive touch panel comprising a laminate between a display panel and a cover layer, the laminate having a viewing-side polarizing plate, a first conductive layer, a dielectric layer, a second conductive layer, and a substrate, the first conductive layer, the dielectric layer, and the second conductive layer constituting a capacitive touch sensor, wherein the first conductive layer, the dielectric layer, the second conductive layer, and the substrate are positioned closer to the cover layer than is the viewing-side polarizing plate, the first conductive layer is formed on one surface of the substrate, the dielectric layer is formed on a surface of the first conductive layer opposite to the substrate side, the second conductive layer is formed on a surface of the dielectric layer opposite to the first conductive layer side, the substrate has an optical film with a phase difference of $(2n-1)\lambda/4$, where n is a positive integer, the viewing-side polarizing plate has a polarizing film, and a slow axis of the optical film intersects a transmission axis of the polarizing film at an angle of about 45° as viewed in a stacking direction. In this way, by providing the substrate closer to the cover layer than is the viewing-side polarizing plate, the substrate having the optical film for imparting a predetermined phase difference to light, and by setting the angle at which the slow axis of the optical film and the transmission axis of the polarizing film intersect to about 45°, the display device with a touch panel can be operated by the operator even through polarized sunglasses. In addition, when the first conductive layer, dielectric layer, and second conductive layer constituting the capacitive touch sensor are formed on the one surface of the substrate in the stated order, it is possible to reduce transparent base plates for forming the conductive layers and simplify the structure of the touch sensor, thereby reducing the thickness between the display panel and the cover layer. In the first aspect, "about 45°" covers angles of, for example, 45°±10°, at which linearly polarized light traveling from the display panel side through the viewing-side polarizing plate towards the cover layer side can be converted by the optical film of the substrate into circularly polarized light or elliptically polarized light to enable operation through polarized sunglasses.

Here, in the display device with a capacitive touch panel according to the first aspect, it is preferred that the first conductive layer is formed on a surface of the substrate on the side of the cover layer, and furthermore, it is more preferred that the polarizing film is positioned at a surface of the viewing-side polarizing plate on the side of the cover layer, and the substrate is bonded to a surface of the polarizing film on the side of the cover layer. In this way, the substrate can be used as a protective film for the polarizing film, which makes it possible to eliminate the need for the cover layer-side protective film of the polarizing film and to further reduce the thickness between the display panel and the cover layer.

In addition, to solve the aforementioned problem advantageously, according to a second aspect of the disclosure, there is provided a display device with a capacitive touch panel comprising a laminate between a display panel and a cover layer, the laminate having a viewing-side polarizing plate, a first conductive layer, a dielectric layer, a second conductive layer, and an optical compensation substrate, the first conductive layer, the dielectric layer, and the second conductive layer constituting a capacitive touch sensor, wherein the first conductive layer, the dielectric layer, the second conductive layer, and the optical compensation substrate are positioned closer to the display panel than is the viewing-side polarizing plate, the first conductive layer is formed on one surface of the optical compensation substrate, the dielectric layer is formed on a surface of the first conductive layer opposite to the optical compensation substrate side, the second conductive layer is formed on a surface of the dielectric layer opposite to the first conductive layer side, and the optical compensation substrate has a phase difference film for optical compensation. In this way, when the optical compensation substrate having the phase difference film for optical compensation is provided closer to the display panel than is the viewing-side polarizing plate, it is possible to compensate for viewing angle dependence, a light leakage phenomenon occurring at the polarizing plate at the time of oblique angle viewing, and the like. In addition, when the first conductive layer, dielectric layer, and second conductive layer constituting the capacitive touch sensor are formed on the one surface of the optical compensation substrate in the stated order, it is possible to reduce transparent base plates for forming the conductive layers and simplify the structure of the touch sensor, thereby reducing the thickness between the display panel and the cover layer.

Here, in the display device with a capacitive touch sensor according to the second aspect, it is preferred that the display device further comprises an optical film with a phase difference of $(2n-1)\lambda/4$, where n is a positive integer, between the cover layer and the viewing-side polarizing plate, the viewing-side polarizing plate has a polarizing film, and a slow axis of the optical film intersects a transmission axis of the polarizing film at an angle of about 45° as viewed in a stacking direction. In this way, by providing the optical film for imparting a predetermined phase difference to light closer to the cover layer than is the viewing-side polarizing plate, and by setting the angle at which the slow axis of the optical film and the transmission axis of the polarizing film intersect to about 45°, the display device with a touch panel can be operated by the operator even through polarized sunglasses.

In the second aspect, "about 45°" covers angles of, for example, 45°±10°, at which linearly polarized light traveling from the display panel side through the viewing-side polarizing plate towards the cover layer side can be converted by the optical film into circularly polarized light or elliptically polarized light to enable operation through polarized sunglasses.

In addition, in the display device with a capacitive touch panel according to the second aspect, it is preferred that the first conductive layer is formed on a surface of the optical compensation substrate on the side of the display panel, the viewing-side polarizing plate has a polarizing film, the polarizing film is positioned at a surface of the viewing-side polarizing plate on the side of the display panel, and the optical compensation substrate is bonded to a surface of the polarizing film on the side of the display panel. In this way, the optical compensation substrate can be used as a protective film for the polarizing film, which makes it possible to eliminate the need for the display panel-side protective film of the polarizing film and to further reduce the thickness between the display panel and the cover layer.

In addition, to solve the aforementioned problem advantageously, according to a third aspect of the disclosure, there is provided a display device with a capacitive touch panel comprising a laminate between a display panel and a cover layer, the laminate having a viewing-side polarizing plate, a first conductive layer, a dielectric layer, and a second conductive layer, the first conductive layer, the dielectric layer, and the second conductive layer constituting a capacitive touch sensor, wherein the first conductive layer is formed on one surface of the viewing-side polarizing plate, the dielectric layer is formed on a surface of the first conductive layer opposite to the viewing-side polarizing plate side, and the second conductive layer is formed on a surface of the dielectric layer opposite to the first conductive layer side. In this way, when the first conductive layer, dielectric layer, and second conductive layer constituting the capacitive touch sensor are formed on the one surface of the viewing-side polarizing plate in the stated order, it is possible to reduce transparent base plates for forming the conductive layers and simplify the structure of the touch sensor, thereby reducing the thickness between the display panel and the cover layer.

Additionally, in the display device with a capacitive touch panel according to the above first to third aspects, the display panel is preferably a liquid crystal panel.

In addition, to solve the aforementioned problem advantageously, according to a fourth aspect of the disclosure, there is provided a display device with a capacitive touch panel comprising a laminate between a display panel and a cover layer, the laminate having a circularly polarizing plate, a first conductive layer, a dielectric layer, and a second conductive layer, the first conductive layer, the dielectric layer, and the second conductive layer constituting a capacitive touch sensor, wherein the circularly polarizing plate includes a substrate and a polarizing plate, the first conductive layer, the dielectric layer, the second conductive layer, and the substrate are positioned closer to the display panel than is the polarizing plate, the first conductive layer is formed on one surface of the substrate, the dielectric layer is formed on a surface of the first conductive layer opposite to the substrate side, the second conductive layer is formed on a surface of the dielectric layer opposite to the first conductive layer side, the substrate has an optical film with a phase difference of $\lambda/4$, the polarizing plate has a polarizing film, and a slow axis of the optical film intersects a transmission axis of the polarizing film at an angle of about 45° as viewed in a stacking direction. In this way, by setting the angle at which the slow axis of the optical film intersects the transmission axis of the polarizing film to about 45°, a circularly polarizing plate can be formed by the polarizing plate and the substrate having the optical film with a phase difference of $\lambda/4$. Additionally, when the circularly polarizing plate comprising, at a position closer to the display panel than is the polarizing plate, the substrate having the optical film for imparting a phase difference of $\lambda/4$ to light is provided between the display panel and the cover layer, it is possible to prevent reflected light of incident external light from making visual recognition of the displayed content difficult. In addition, when the first conductive layer, dielectric layer, and second conductive layer constituting the capacitive touch sensor are formed on the one surface of the substrate in the stated order, it is possible to reduce transparent base plates for forming the conductive layers and simplify the structure of the touch sensor, thereby reducing the thickness between the display panel and the cover layer.

In the fourth aspect, "about 45°" covers angles of, for example, 45°±5°, at which it is possible to prevent reflected light of incident external light from making visual recognition of the displayed content difficult. In addition, the polarizing plate and substrate constituting the circularly polarizing plate may be arranged apart from each other in the stacking direction, or another member may be interposed between the polarizing plate and the substrate.

Here, in the display device with a capacitive touch panel according to the fourth aspect, it is preferred that the first conductive layer is formed on a surface of the substrate on the side of the display panel, and furthermore, it is more preferred that the polarizing film is positioned at a surface of the polarizing plate on the side of the display panel, and the substrate is bonded to a surface of the polarizing film on the side of the display panel. In this way, the substrate can be used as a protective film for the polarizing film, which makes it possible to eliminate the need for the display panel-side protective film of the polarizing film and to further reduce the thickness between the display panel and the cover layer.

In addition, to solve the aforementioned problem advantageously, according to a fifth aspect of the disclosure, there is provided a display device with a capacitive touch panel comprising a laminate between a display panel and a cover layer, the laminate having a circularly polarizing plate, a first conductive layer, a dielectric layer, and a second conductive layer, the first conductive layer, the dielectric layer, and the second conductive layer constituting a capacitive touch sensor, wherein the circularly polarizing plate includes a substrate and a polarizing plate, the substrate is positioned closer to the display panel than is the polarizing plate, the first conductive layer is formed on one surface of the polarizing plate, the dielectric layer is formed on a surface of the first conductive layer opposite to the polarizing plate side, the second conductive layer is formed on a surface of the dielectric layer opposite to the first conductive layer side, the substrate has an optical film with a phase difference of $\lambda/4$, the polarizing plate has a polarizing film, and a slow axis of the optical film intersects a transmission axis of the polarizing film at an angle of about 45° as viewed in a stacking direction. In this way, by setting the angle at which the slow axis of the optical film intersects the transmission axis of the polarizing film to about 45°, a circularly polarizing plate can be formed by the polarizing plate and the substrate having the optical film with a phase difference of $\lambda/4$. Additionally, when the circularly polarizing plate comprising, at a position closer to the display panel than is the polarizing plate, the substrate having the optical film for imparting a phase difference of $\lambda/4$ to light is provided between the display panel and the cover layer, it is possible to prevent reflected light of incident external light from making visual recognition of the displayed content difficult. In addition, when the first conductive layer, dielectric layer, and second conductive layer constituting the capacitive touch sensor are formed on the one surface of the polarizing plate in the stated order, it is possible to reduce transparent base plates for forming the conductive layers and simplify the structure of the touch sensor, thereby reducing the thickness between the display panel and the cover layer.

In the fifth aspect, "about 45°" covers angles of, for example, 45°±5°, at which it is possible to prevent reflected light of incident external light from making visual recognition of the displayed content difficult. In addition, the polarizing plate and substrate constituting the circularly polarizing plate may be arranged apart from each other in the stacking direction, or another member may be interposed between the polarizing plate and the substrate.

Here, in the display device with a capacitive touch panel according to the fifth aspect, it is preferred that the first conductive layer is formed on a surface of the polarizing plate on the side of the cover layer, and furthermore, it is more preferred that the polarizing film is positioned at a surface of the polarizing plate on the side of the display panel, and the substrate is bonded to a surface of the polarizing film on the side of the display panel. In this way, the substrate can be used as a protective film for the polarizing film, which makes it possible to eliminate the need for the display panel-side protective film of the polarizing film and to further reduce the thickness between the display panel and the cover layer.

Additionally, in the display device with a capacitive touch panel according to the above fourth and fifth aspects, it is preferred that the optical film has reverse wavelength dispersion characteristics. In this way, the phase difference imparted to light incident on the optical film increases in absolute value with increasing wavelength of the light and decreases in absolute value with decreasing wavelength of the light, and therefore desirable polarization characteristics can be obtained over a wide wavelength range, which makes it possible to convert linearly polarized light into circularly polarized light in a favorable manner.

In addition, to solve the aforementioned problem advantageously, according to a sixth aspect of the disclosure, there is provided a display device with a capacitive touch panel comprising a laminate between a display panel and a cover layer, the laminate having a circularly polarizing plate, a first conductive layer, a dielectric layer, and a second conductive layer, the first conductive layer, the dielectric layer, and the second conductive layer constituting a capacitive touch sensor, wherein the circularly polarizing plate includes a polarizing plate, a substrate positioned closer to the display panel than is the polarizing plate, and a polarizing plate-side substrate positioned between the polarizing plate and the substrate, the polarizing plate has a polarizing film, the substrate has an optical film with a phase difference of $\lambda/4$, the polarizing plate-side substrate has another optical film with a phase difference of $\lambda/2$, the first conductive layer is formed on one surface of a conductive-layer base member, the dielectric layer is formed on a surface of the first conductive layer opposite to the conductive-layer base member side, the second conductive layer is formed on a surface of the dielectric layer opposite to the first conductive layer side, and the conductive-layer base member is the substrate, the polarizing plate-side substrate, or the polarizing plate. In this way, when the circularly polarizing plate comprising the polarizing plate, the polarizing plate-side substrate having said another optical film for imparting a phase difference of $\lambda/2$ to light, and the substrate having the optical film for imparting a phase difference of $\lambda/4$ to light is provided between the display panel and the cover layer, it is possible to prevent reflected light of incident external light from making visual recognition of the displayed content difficult. In addition, when the first conductive layer, dielectric layer, and second conductive layer constituting the capacitive touch sensor are formed on the one surface of the conductive-layer base member, which is selected from the substrate, the polarizing plate-side substrate, or the polarizing plate, in the stated order, it is possible to reduce transparent base plates for forming the conductive layers and simplify the structure of the touch sensor, thereby reducing the thickness between the display panel and the cover layer.

As used herein, the "circularly polarizing plate" refers to a member that is capable of converting light incident from the cover layer side towards the display panel side into linearly polarized light, then converting the linearly polarized light into circularly polarized light, and further converting reverse circularly polarized light resulting from the circularly polarized light reflected at the display panel, into another linearly polarized light orthogonal to the linearly polarized light, to thereby prevent transmission of the reflected light into the cover layer side. Accordingly, in the sixth aspect, it suffices to arrange the substrate, the polarizing plate-side substrate, and the polarizing plate so as to form a circularly polarizing plate. Additionally, the polarizing plate, substrate, and polarizing plate-side substrate constituting the circularly polarizing plate may be arranged apart from each other in the stacking direction, or another member may be interposed between these members.

Here, in the display device with a capacitive touch panel according to the sixth aspect, it is preferred that the polarizing film is positioned at a surface of the polarizing plate on the side of the display panel, and the polarizing plate-side substrate is bonded to a surface of the polarizing film on the side of the display panel. In this way, the polarizing plate-side substrate can be used as a protective film for the polarizing film, which makes it possible to eliminate the need for the display panel-side protective film of the polarizing film and to further reduce the thickness between the display panel and the cover layer.

Moreover, in the display device with a capacitive touch panel according to the sixth aspect, it is preferred that as viewed in a stacking direction, a slow axis of the optical film intersects a transmission axis of the polarizing film at an angle of about 75°, and a slow axis of said another optical film intersects the transmission axis of the polarizing film at an angle of about 15°.

In addition, in the display device with a capacitive touch panel according to the sixth aspect, it is preferred that as viewed in the stacking direction, the slow axis of the optical film intersects the transmission axis of the polarizing film at an angle of about 90°, and the slow axis of said another optical film intersects the transmission axis of the polarizing film at an angle of about 22.5°.

In this way, it is possible to form a so-called wideband quarter wavelength plate by using the optical film and said another optical film, to yield desired polarization characteristics in a wide wavelength range, and to convert linearly polarized light into circularly polarized light favorably. Therefore, it is possible to prevent reflected light of incident external light from making visual recognition of the displayed content difficult.

In the sixth aspect, "about 75°" and "about 15°" cover angles of, for example, "75°±5°" and "15°±5°", respectively, at which a wideband quarter wavelength plate can be formed to prevent reflected light of incident external light from making visual recognition of the displayed content difficult. Additionally, "about 75°" and "about 15°" represent angles measured in the same direction with respect to the transmission axis of the polarizing film. In addition, "about 90°" and "about 22.5°" cover angles of, for example, "90°±50" and "22.5°±5°", respectively, at which a wideband quarter wavelength plate can be formed to prevent reflected light of incident external light from making visual recognition of the displayed content difficult. Additionally, "about 90°" and "about 22.5°" represent angles measured in the same direction with respect to the transmission axis of the polarizing film.

Additionally, in the display device with a capacitive touch panel according to the fourth to sixth aspects, the display panel preferably comprises an organic EL display panel.

In addition, in the display device with a capacitive touch panel according to the first to second and fourth to sixth aspects, the optical film and/or said another optical film is preferably an obliquely stretched film. When the optical film and/or said another optical film is an obliquely stretched film, a laminate including the polarizing plate and the optical film and/or said another optical film can be produced easily by a roll-to-roll process.

Moreover, in the display device with a capacitive touch panel according to the first to second and fourth to sixth aspects, it is preferred that the optical film, the phase difference film, and/or said another optical film is formed from a cycloolefin polymer, polycarbonate, polyethylene terephthalate, or triacetyl cellulose.

Additionally, in the display device with a capacitive touch panel according to the first to sixth aspects, it is preferred that the first conductive layer and the second conductive layer are formed by using indium tin oxide, carbon nanotubes, or silver nanowires.

Advantageous Effect

According to the disclosure, it is possible to provide a display device with a capacitive touch panel that is reduced in thickness.

In particular, according to the disclosure, it is possible to provide a display device with a capacitive touch panel that can be operated even through polarized sunglasses and is reduced in thickness. According to the disclosure, it is also possible to provide a display device with a capacitive touch panel that can prevent reflected light of incident external light from making visual recognition of the displayed content difficult, and that is reduced in thickness.

BRIEF DESCRIPTION OF DRAWINGS

In the accompanying drawings:

FIG. 7 contains cross-sectional views: (a) schematically illustrating a cross-sectional structure of the main part of a seventh display device with a capacitive touch panel according to the disclosure, and (b) to (d) each schematically illustrating a cross-sectional structure of the main part of a variation of the display device with a capacitive touch panel illustrated in FIG. 7(a).

DETAILED DESCRIPTION

Figure 1:
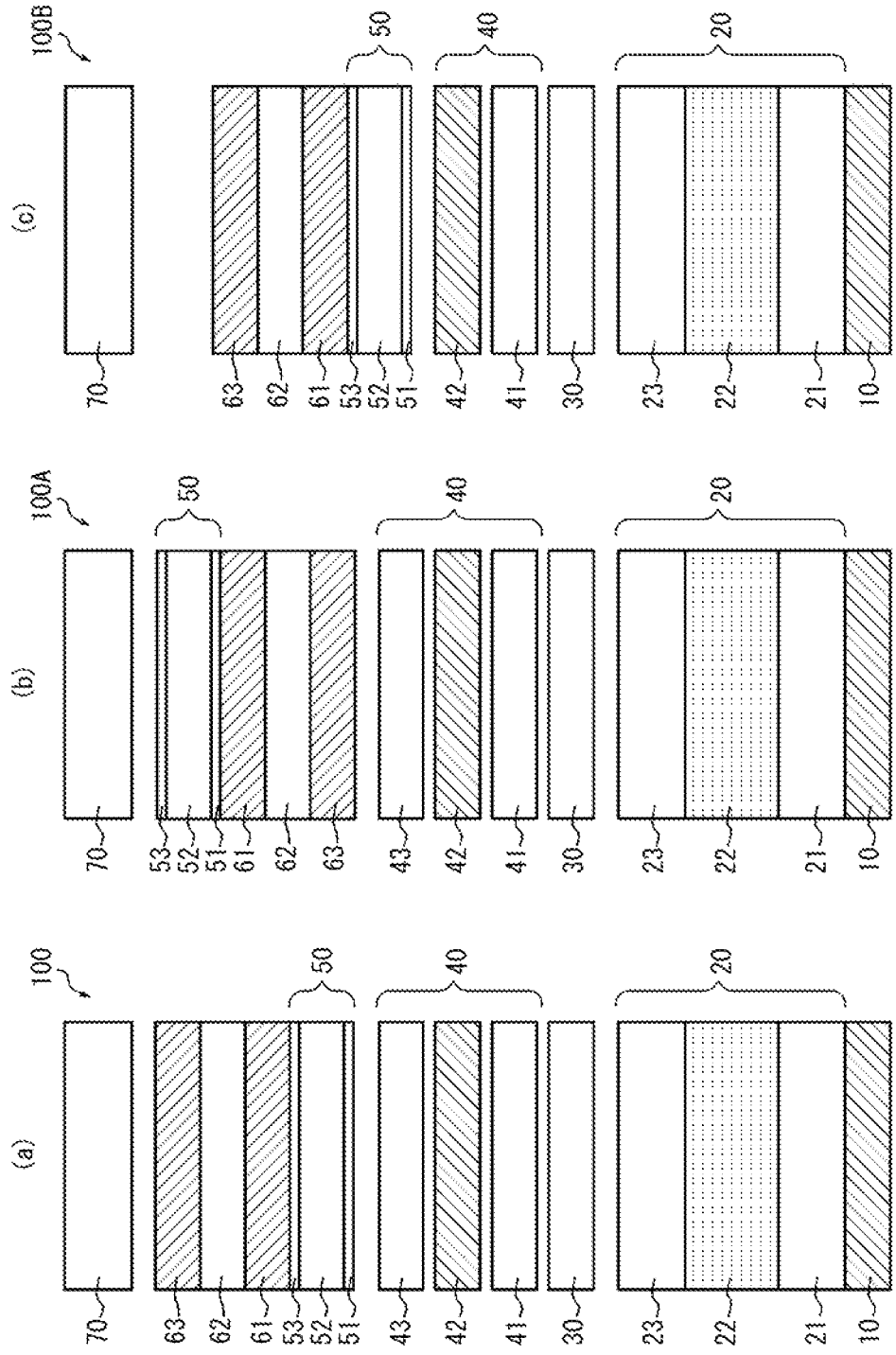
FIG. 1 contains cross-sectional views: (a) schematically illustrating a cross-sectional structure of the main part of a first display device with a capacitive touch panel according to the disclosure, and (b) and (c) each schematically illustrating a cross-sectional structure of the main part of a variation of the display device with a capacitive touch panel illustrated in FIG. 1(a)

Embodiments of the disclosed display device with a capacitive touch panel will be described in detail with reference to the drawings. It is noted that the same reference numerals indicate the same components throughout the drawings. It is also noted that an additional layer or film may also be provided in any space between the members illustrated in the drawings within a range in which the object of the disclosure can be achieved. Here, examples of such additional layers or films include adhesive layers or pressure sensitive adhesive layers that are used to bond members together into a single structure. Preferred adhesive layers or pressure sensitive adhesive layers are transparent to visible light and do not cause any unnecessary phase difference.

Display Device with Capacitive Touch Panel (First Embodiment)

FIG. 1(a) schematically illustrates a cross-sectional structure of the main part of a first display device with a capacitive touch panel according to the disclosure. It is noted here that the display device with a capacitive touch panel 100 illustrated in FIG. 1(a) is a device that has both a display function and a touch sensor function, the display function for displaying image information on the screen and the touch sensor function for detecting a position on the screen touched by the operator and outputting it as an information signal to the outside.

The display device with a capacitive touch panel 100 comprises the following members stacked in the stated order from the side from which the backlight is emitted (the lower side of FIG. 1(a), and this side is hereinafter referred to simply as the "backlight side") towards the side from which the operator views an image (the upper side of FIG. 1(a), and this side is hereinafter referred to simply as the "viewing side"): a backlight-side polarizing plate 10; a liquid crystal panel as a display panel 20; a phase difference film 30 for optical compensation; a viewing-side polarizing plate 40; a substrate 50; a first conductive layer 61; a dielectric layer 62; a second conductive layer 63; and a cover layer 70. Additionally, in the display device with a capacitive touch panel 100, the first conductive layer 61 is formed on one surface of the substrate 50 (on the cover layer 70 side), the dielectric layer 62 is formed on a surface of the first conductive layer 61 opposite to the substrate 50 side (on the cover layer 70 side), and the second conductive layer 63 is formed on a surface of the dielectric layer 62 opposite to the first conductive layer 61 side (on the cover layer 70 side).

It is noted that the backlight-side polarizing plate 10, the display panel 20, the phase difference film 30, the viewing-side polarizing plate 40, the substrate 50 on which the first conductive layer 61, the dielectric layer 62, and the second conductive layer 63 are formed, and the cover layer 70 may be integrated into a single structure by bonding the members together using known means, such as providing adhesive layers or pressure sensitive adhesive layers, performing plasma treatment on the surfaces of members, and the like. That is, for example, adhesive layers or pressure sensitive adhesive layers are formed in gaps in the layered structure illustrated in FIG. 1(a).

[Backlight-Side Polarizing Plate]

As the backlight-side polarizing plate 10, a known polarizing plate having a polarizing film, for example, a polarizing plate formed with a polarizing film sandwiched between two protective films may be used. Additionally, the backlight-side polarizing plate 10 is arranged so that a transmission axis of the polarizing film of the backlight-side polarizing plate 10 and a transmission axis of a polarizing film 42 of the viewing-side polarizing plate 40 as detailed below are set orthogonal to each other as viewed in the stacking direction (the vertical direction in FIG. 1 (a)), and enables images to be displayed by use of the liquid crystal panel as the display panel 20.

[Display Panel (Liquid Crystal Panel)]

The liquid crystal panel as the display panel 20 may be a liquid crystal panel that is formed with a liquid crystal layer sandwiched between two base plates, for example, with a liquid crystal layer 22 sandwiched between a thin film transistor base plate 21 positioned on the backlight side and a color filter base plate 23 positioned on the viewing side. Additionally, in the display device with a capacitive touch panel 100, the liquid crystal layer 22 of the liquid crystal panel, which is arranged between the backlight-side polarizing plate 10 and the viewing-side polarizing plate 40, is energized to present a desired image to the operator.

It is noted that as the thin film transistor base plate 21 and the color filter base plate 23, known base plates may be used. In addition, as the liquid crystal layer 22, a known liquid crystal layer may be used. It is noted that the display panel 20 which may be used in the display device with a capacitive touch panel disclosed herein is not limited to the liquid crystal panel with the aforementioned structure.

[Phase Difference Film]

The phase difference film 30 is an optical compensation film which compensates for viewing angle dependence of the liquid crystal layer 22, a light leakage phenomenon occurring at the polarizing plates 10, 40 at the time of oblique angle viewing, and the like to thereby improve viewing angle characteristics of the display device with a capacitive touch panel 100. Additionally, as the phase difference film 30, for example, a known vertical uniaxial stretched film, a known horizontal uniaxial stretched film, a known vertical and horizontal biaxial stretched film, or a phase difference film obtained by polymerizing a liquid crystalline compound may be used. Specifically, the phase difference film 30 is not particularly limited, and examples thereof include a film that is obtained by uniaxially or biaxially stretching a thermoplastic resin film produced by forming a thermoplastic resin such as a cycloolefin polymer into a film by a known method. Additionally, examples of commercially available thermoplastic resin films include "Essina" and "SCA40" (manufactured by Sekisui Chemical Co., Ltd.), "ZEONOR Film" (manufactured by Zeon Corporation), and "ARTON FILM" (manufactured by JSR Corporation), all of which are trade names.

It is noted that hard coat layers or optical functional layers may be formed on both surfaces of the phase difference film 30, as is the case with the substrate 50 as detailed below.

In addition, the phase difference film 30 may be arranged so that a slow axis of the phase difference film 30 and the transmission axis of the polarizing film of each of the polarizing plates 10, 40 are, for example, parallel or orthogonal to each other as viewed in the stacking direction.

[Viewing-Side Polarizing Plate]

The viewing-side polarizing plate 40 is not particularly limited, and an example thereof may be a polarizing plate 40 that is formed with the polarizing film 42 sandwiched between two protective films (backlight-side protective film 41 and cover layer-side protective film 43).

[Substrate with Optical Film]

The substrate 50 having the first conductive layer 61 formed on one surface thereof in the stacking direction (on the cover layer 70 side in FIG. 1(a)) comprises an optical film 52 with a phase difference of $(2n-1)\lambda/4$, where n is a positive integer, and hard coat layers 51, 53 formed on both surfaces of the optical film 52. It is noted that the optical film 52 of the substrate 50 is arranged so that a slow axis of the optical film 52 and the transmission axis of the polarizing film 42 of the viewing-side polarizing plate 40 intersect at a predetermined angle as viewed in the stacking direction.

In this case, "a predetermined angle" refers to an angle at which linearly polarized light traveling from the side of the liquid crystal panel as the display panel 20 through the viewing-side polarizing plate 40 towards the side of the cover layer 70 can be converted into circularly polarized light or elliptically polarized light to enable the operator to visually recognize the displayed content even through polarized sunglasses. Specifically, the predetermined angle is about 45°, which more specifically covers angles of 45°±10°, preferably 45°±3°, more preferably 45°±1°, and even more preferably 45°±0.30.

In addition, the phrase "with a phase difference of $(2n-1)\lambda/4$, where n is a positive integer," indicates that the phase difference (retardation Re) to be applied to light transmitted through the optical film 52 in the stacking direction is about $(2n-1)/4$ times the wavelength $\lambda$ of the light, where n is a positive integer, which is preferably 1. Specifically, in the case where the transmitted light has a wavelength range from 400 nm to 700 nm, and when Re is about $(2n-1)/4$ times the wavelength $\lambda$, it is meant that Re is in the range of $(2n-1)\lambda/4\pm65$ nm, preferably in the range of $(2n-1)\lambda/4\pm30$ nm, and more preferably in the range of $(2n-1)\lambda/4\pm10$ nm. It is noted that Re is the retardation in the in-plane direction represented by the equation $Re=(nx-ny)\times d$, where nx is the refractive index in the film plane in the slow axis direction, ny is the refractive index in a direction orthogonal, in the film plane, to the slow axis in the film plane, and d is the thickness of the optical film 52.

[[Optical Film]]

As the optical film 52, it is possible to use a film subjected to orientation treatment that is obtained by forming a thermoplastic resin into a film and stretching the film.

Here, a thermoplastic resin may be stretched by any known stretching method, yet a preferred method is oblique stretching. The reason is as described below. Although the optical film 52 needs to be stacked such that the slow axis of the optical film 52 and the transmission axis of the polarizing film 42 of the viewing-side polarizing plate 40 intersect at a predetermined angle, a stretched film subjected to general stretching treatment (vertical stretching treatment or horizontal stretching treatment) has an optical axis oriented in a direction either parallel or orthogonal to the width direction of the film. Accordingly, to stack the general stretched film and the polarizing film one on top of the other at a predetermined angle, the stretched film needs to be cut at an angle into a sheet of material. An obliquely stretched film, however, has an optical axis oriented in a direction inclined at an angle with respect to the width direction of the film. Accordingly, when an obliquely stretched film is used as the optical film 52, a laminate including the viewing-side polarizing plate 40 and the optical film 52 can be produced easily by a roll-to-roll process. It is noted that in the case of producing a laminate including the viewing-side polarizing plate 40 and the optical film 52 by a roll-to-roll process, it suffices to adjust the orientation angle of the obliquely stretched film used as the optical film 52 such that the slow axis of the optical film 52 and the transmission axis of the polarizing film 42 intersect at the aforementioned predetermined angle in the resulting laminate.

Methods for use in the oblique stretching may include those described in JPS50-83482A, JPH2-113920A, JPH3-182701A, JP2000-9912A, JP2002-86554A, JP2002-22944A, and the like. The stretching machine used for oblique stretching is not particularly limited, and a possible stretching machine is a conventionally known tenter-type stretching machine. Although there are different types of tenter-type stretching machines including horizontal uniaxial stretching machines and simultaneous biaxial stretching machines, the stretching machine used is not limited to a particular type, but rather may be selected from a variety of stretching machines as long as it allows for continuous oblique stretching of a long film.

In addition, the temperature at which the thermoplastic resin is subjected to oblique stretching is preferably in the range of Tg−30° C. to Tg+60° C., and more preferably in the range of Tg−10° C. to Tg+50° C., where Tg is the glass-transition temperature of the thermoplastic resin. In addition, the stretching ratio is normally from 1.01 times to 30 times, preferably from 1.01 times to 10 times, and more preferably from 1.01 times to 5 times.

Examples of the thermoplastic resins which can be used to form the optical film 52 include, but are not particularly limited to, cycloolefin polymers, polycarbonate, polyarylate, polyethylene terephthalate, triacetyl cellulose, polysulfone, polyethersulfone, polyphenylene sulfide, polyimide, polyamide imide, polyethylene, polypropylene, polyvinyl chloride, polystyrene, polyolefin, polyvinyl alcohol, and polyvinyl chloride-polymethyl methacrylate. Among these, preferred are cycloolefin polymers, polycarbonate, polyethylene terephthalate, and triacetyl cellulose, more preferred are cycloolefin polymers, and particularly preferred are cycloolefin polymers without a polar group such as an amino group, a carboxyl group, and a hydroxyl group.

Examples of cycloolefin polymers may include norbornene-based resins, monocyclic olefin-based resins, cyclic conjugated diene-based resins, vinyl alicyclic hydrocarbon-based resins, and hydrides thereof. Among these, norbornene-based resins are suitably used because of their good transparency and good formability.

Examples of norbornene-based resins may include: a ring-opened polymer of a monomer with norbornene structure, a ring-opened copolymer of a monomer with norbornene structure and another monomer, and hydrides thereof; and an addition polymer of a monomer with norbornene structure, an addition copolymer of a monomer with norbornene structure and another monomer, and hydrides thereof.

Examples of commercially available cycloolefin polymers include "Topas" (manufactured by Ticona GmbH), "ARTON" (manufactured by JSR Corporation), "ZEONOR" and "ZEONEX" (manufactured by Zeon Corporation), "APEL" (manufactured by Mitsui Chemicals, Inc.), all of which are trade names. By forming such a cycloolefin-based resin into a film, the optical film 52 made from a thermoplastic resin can be obtained. For film formation, a known film formation method is appropriately used, such as a solvent casting method and a melt extrusion method. In addition, cycloolefin-based resin films obtained by a film formation method are also commercially available, and examples thereof include "Essina" and "SCA40" (manufactured by Sekisui Chemical Co., Ltd.), "ZEONOR Film" (manufactured by Zeon Corporation), and "ARTON FILM" (manufactured by JSR Corporation), all of which are trade names. A thermoplastic resin film before stretching is generally a long unstretched film. In this context, a "long" film indicates a film having a length of at least about 5 times or more, preferably 10 times or more, the width of the film, and specifically a film having a length long enough for the film to be wound into a roll for storage or transportation.

The aforementioned thermoplastic resin has a glass-transition temperature of preferably 80° C. or higher, and more preferably from 100° C. to 250° C. In addition, the photoelastic coefficient of the thermoplastic resin is, in absolute value, preferably $10 \times 10^{-12}$ $Pa^{-1}$ or less, more preferably $7 \times 10^{-12}$ $Pa^{-1}$ or less, and particularly preferably $4 \times 10^{-12}$ $Pa^{-1}$ or less. Photoelastic coefficient C is a value represented by $C = \Delta n / \sigma$, where $\Delta n$ is birefringence and $\sigma$ is stress. By using a transparent thermoplastic resin whose photoelastic coefficient falls within this range, it is possible to reduce variations in in-plane direction retardation Re of the optical film. Moreover, when such an optical film is applied to a display device using a liquid crystal panel, it is possible to suppress a phenomenon that alters the hue at edges of the display screen of the display device.

It is noted that the thermoplastic resin used to form the optical film 52 may be blended with other compounding agents. The compounding agents are not particularly limited, and examples thereof include layered crystal compounds; inorganic fine particles; stabilizers such as antioxidants, heat stabilizers, light stabilizers, weathering stabilizers, ultraviolet absorbers, and near-infrared absorbers; resin modifiers such as lubricants and plasticizers; coloring agents such as dyes and pigments; and antistatic agents. These compounding agents may be used alone or in combination of two or more, and the blending amount thereof is properly selected within a range not to impair the object of the disclosure.

Examples of antioxidants include phenolic antioxidants, phosphoric antioxidants, and sulfuric antioxidants, and among these preferred are phenolic antioxidants, and particularly preferred are alkyl-substituted phenolic antioxidants. By blending these antioxidants, it is possible to prevent coloring of the film and decrease in strength of the film due to oxidation deterioration during the film formation, without deteriorating transparency, low water absorption properties, and the like. These antioxidants may be used alone or in combination of two or more, and the blending amount thereof is properly selected within a range not to impair the object of the disclosure, yet is normally 0.001 parts by mass to 5 parts by mass, and preferably 0.01 parts by mass to 1 part by mass, per 100 parts by mass of the thermoplastic resin.

Inorganic fine particles that have an average particle size of 0.7 μm to 2.5 μm and a refractive index of 1.45 to 1.55 are preferred. Specific examples thereof include clay, talc, silica, zeolite, and hydrotalcite, and among these preferred are silica, zeolite, and hydrotalcite. The addition amount of inorganic fine particles is not particularly limited, yet is normally 0.001 parts by mass to 10 parts by mass, and preferably 0.005 parts by mass to 5 parts by mass, per 100 parts by mass of the thermoplastic resin.

Examples of lubricants include hydrocarbon-based lubricants; fatty acid-based lubricants; higher alcohol-based lubricants; fatty acid amide-based lubricants; fatty acid ester-based lubricants; and metallic soap-based lubricants. Among these, preferred are hydrocarbon-based lubricants, fatty acid amide-based lubricants, and fatty acid ester-based lubricants. Further, of these preferred lubricants, particularly preferred are those having a melting point of 80° C. to 150° C. and an acid value of 10 mg KOH/mg or lower. If the melting point is out of the range of 80° C. to 150° C. and in addition the acid value is greater than 10 mg KOH/mg, the haze value can increase.

Additionally, the thickness of the stretched film used as the optical film 52 is, for example, suitably set in the range of approximately 5 μm to 200 μm, and is preferably from 20 μm to 100 μm. If the thickness of the film is excessively small, strength or retardation value can be insufficient, while the thickness is excessively large, transparency can be deteriorated and it can be difficult to obtain a desired retardation value.

In addition, for the stretched film used as the optical film 52, it is preferred that the content of volatile components remaining in the film is 100 ppm by mass or less. A stretched film whose volatile component content is in the above range is free from display unevenness even after prolonged use, and presents great stability of optical properties. Here, the volatile components are substances that are contained in trace amounts in the thermoplastic resin, that have a molecular weight of 200 or less, and that have a relatively low boiling point, and examples thereof include residual monomers remained in the thermoplastic resin after polymerization of the thermoplastic resin, and the solvent. The content of volatile components may be determined by analyzing the thermoplastic resin with gas chromatography.

Examples of methods of obtaining a stretched film having a volatile component content of 100 ppm by mass or less include: (a) performing oblique stretching of an unstretched film having a volatile component content of 100 ppm by mass or less; and (b) performing oblique stretching of an unstretched film having a volatile component content of more than 100 ppm by mass, and drying the film during or after the oblique stretching to reduce the volatile component content. Among these, the method (a) is preferred for obtaining a stretched film with a lower volatile component content. In the method (a), to obtain an unstretched film having a volatile component content of 100 ppm by mass or less, it is preferred to perform melt extrusion of a resin having a volatile component content of 100 ppm by mass or less.

Additionally, the stretched film used as the optical film 52 preferably has a saturated water absorption of 0.01 mass % or less, and more preferably 0.007 mass % or less. If the saturated water absorption exceeds 0.01 mass %, the stretched film may be subject to dimensional changes depending on the usage environment, and internal stress may occur. Additionally, for example, when using a reflection type liquid crystal panel as the display panel 20, display unevenness can occur, such as partial lightening of a black presentation (assuming a whitish appearance). By contrast, a stretched film whose saturated water absorption is in the above range is free from display unevenness even after prolonged use, and presents great stability of optical properties.

As used herein, the "saturated water absorption" may be measured following ASTM D570. In addition, the saturated water absorption of the stretched film may be adjusted by changing, for example, the type of the thermoplastic resin used in the formation of the film.

Also, the relative permittivity of the stretched film used as the optical film 52 is preferably 2 or more and preferably 5 or less, and particularly preferably 2.5 or less.

As used herein, the "relative permittivity" may be measured in accordance with ASTM D150.

[[Hard Coat Layer]]

The hard coat layers 51, 53 formed on both surfaces of the optical film 52 are for preventing damage to and curling of the optical film 52. As the material used in the formation of the hard coat layers 51, 53, a material that shows a hardness of "HB" or higher in the pencil hardness test prescribed in JIS K5700 is suitable. Examples of such materials include: hard coat layer-forming organic materials such as organic silicone-based, melamine-based, epoxy-based, acrylate-based, and polyfunctional (meth)acrylic-based compounds; and hard coat layer-forming inorganic materials such as silicon dioxide. Among these, (meth)acrylate-based compounds and polyfunctional (meth)acrylic-based compounds are preferably used as the hard coat layer-forming material in view of their good adhesive strength and excellent productivity. As used herein, "(meth)acrylate" refers to acrylate and/or methacrylate, and "(meth)acrylic" refers to acrylic and/or methacrylic.

Examples of (meth)acrylates include those having one polymerizable unsaturated group per molecule, those having two polymerizable unsaturated groups per molecule, those having three or more polymerizable unsaturated groups per molecule, and (meth)acrylate oligomers containing three or more polymerizable unsaturated groups per molecule. The (meth)acrylates may be used alone or in combination of two or more.

The method of forming the hard coat layers is not particularly limited. The hard coat layers are formed by: coating a coating liquid including the hard coat layer-forming material on the optical film 52 by a known method, such as a dipping method, a spray method, a slide coating method, a bar coating method, a roll coater method, a die coater method, a gravure coater method, and a screen printing method; removing the solvent by drying in air or in a nitrogen atmosphere or the like; and subsequently, either applying thereon an acrylic-based hard coat layer material and irradiating it with ultraviolet light, electron beam, or the like so as to be cured by crosslinking, or applying thereon a silicone-based, melamine-based, or epoxy-based hard coat layer material and causing it to thermoset. Since the film thickness of the coating film tends to become uneven during the drying process, it is preferred to adjust and control air intake and exhaust to avoid deterioration in the appearance of the coating film, so that the coating film becomes uniform over the entire surface. When using an ultraviolet curable material, the irradiation time it takes for the hard coat layer-forming material after the coating to be cured by being irradiated with ultraviolet light is usually in the range of 0.01 seconds to 10 seconds, and the amount of irradiation from the energy ray source is usually in the range of 40 mJ/cm$^2$ to 1000 mJ/cm$^2$ in terms of cumulative exposure with ultraviolet light wavelength of 365 nm. The ultraviolet light irradiation may be performed in an inert gas such as nitrogen and argon, or in air.

It is noted that if the hard coat layers 51, 53 are provided, surface treatment may be applied to the stretched film used as the optical film 52 for the purpose of increasing the adhesiveness to the hard coat layers 51, 53. Examples of the surface treatment include plasma treatment, corona treatment, alkali treatment, and coating treatment. In particular, in the case where the optical film 52 is formed from a thermoplastic norbornene-based resin, the use of corona treatment allows for providing strong adhesion between the optical film 52 formed from the above thermoplastic norbornene-based resin and the hard coat layers 51, 53. As a corona treatment condition, the amount of irradiation of corona discharge electron is preferably 1 W/m$^2$/min to 1000 W/m$^2$/min. The contact angle with water of the optical film 52 after the above corona treatment is preferably from 10° to 50°. In addition, coating with the coating liquid including the hard coat layer-forming material may be performed immediately after the corona treatment or after neutralization. For better appearance of the hard coat layers 51, 53, however, the coating is preferably performed after neutralization.

The hard coat layers 51, 53 formed on the optical film 52 normally have an average thickness of 0.5 μm or more and 30 μm or less, and preferably 2 μm or more and 15 μm or less. If the hard coat layers 51, 53 are increased in thickness excessively out of this range, this may cause a problem with visibility, while if the hard coat layers 51, 53 are reduced in thickness excessively, this may result in poor scratch resistance.

The haze of the hard coat layers 51, 53 is 0.5% or less, and preferably 0.3% or less. By setting such haze values, the hard coat layers 51, 53 can be used suitably in the display device with a touch panel 100.

It is noted that to the hard coat layer-forming material may be added, without departing from the spirit of the disclosure, organic particles, inorganic particles, a photosensitizer, a polymerization inhibitor, a polymerization initiation aid, a leveling agent, a wettability improving agent, a surfactant, a plasticizer, an ultraviolet absorber, an antioxidant, an antistatic agent, a silane coupling agent, and the like.

It is noted that in the display device with a capacitive touch panel according to the disclosure, the substrate 50 may not have the hard coat layers 51, 53, or alternatively the substrate 50 may have an optical functional layer, such as an index matching layer and a low refractive index layer, instead of or in addition to the hard coat layers 51, 53.

[[Index Matching Layer]]

Here, an index matching layer is provided (at the interface) between the optical film 52 of the substrate 50 and a member arranged adjacent to the substrate 50, for example, the first conductive layer 61, for the purpose of preventing reflection of light at the interface between the layers caused by the difference in refractive index between the optical film 52 and the first conductive layer 61. Examples of the index matching layer include those comprising multiple high refractive index films and multiple low refractive index films that are alternately arranged, and resin layers comprising metals such as zirconia. Even if the optical film 52 and a member arranged adjacent to the substrate 50 (for example, the first conductive layer 61) greatly differ in refractive index, arranging an index matching layer makes it possible to prevent the reflectance from varying significantly at regions in the substrate 50, depending on whether the first conductive layer 61 is provided or not.

[[Low Refractive Index Layer]]

A low refractive index layer is provided for the purpose of preventing reflection of light and may be provided, for example, on each of the hard coat layers 51, 53. If provided on the hard coat layers 51, 53, the respective low refractive index layers represent layers, each having a refractive index lower than that of the hard coat layers 51, 53. The refractive index of each low refractive index layer is preferably in the range of 1.30 to 1.45, and more preferably in the range of 1.35 to 1.40, at 23° C. and wavelength of 550 nm.

As the low refractive index layers, inorganic compounds that are formed from $SiO_2$, $TiO_2$, NaF, $Na_3AlF_6$, LiF, $MgF_2$, $CaF_2$, SiO, SiOx, $LaF_3$, $CeF_3$, $Al_2O_3$, $CeO_2$, $Nd_2O_3$, $Sb_2O_3$, $Ta_2O_5$, $ZrO_2$, ZnO, ZnS, or the like are preferred. In addition, a mixture of an inorganic compound with an organic compound such as an acrylic resin, a urethane resin, and a siloxane-based polymer is preferably used as the low refractive index layer-forming material. One example is a low refractive index layer that is formed by applying a composition containing an ultraviolet curable resin and hollow silica particles, and irradiating with ultraviolet light. The film thickness of the low refractive index layer is preferably 70 nm or more and 120 nm or less, and more preferably 80 nm or more and 110 nm or less. If the film thickness of the low refractive index layer is more than 120 nm, reflected colors are so tinged that color reproducibility is lost at the time of black presentation, which fact may reduce visibility and cause undesirable results.

[First Conductive Layer]

The first conductive layer 61 is formed on one surface (on the cover layer 70 side) of the substrate 50. Additionally, the first conductive layer 61 forms a capacitive touch sensor, in conjunction with the second conductive layer 63 positioned apart in the stacking direction across the dielectric layer 62.

Here, the first conductive layer 61 may be any layer as long as it has transmittance in the visible light region and has conductivity, and may be formed by using any suitable material including, but not particularly limited to, conductive polymers; conductive pastes such as silver paste and polymer paste; metal colloids such as gold and copper; metal oxides such as indium tin oxide (tin-doped indium oxide: ITO), antimony-doped tin oxide (ATO), fluorine-doped tin oxide (FTO), aluminum-doped zinc oxide (AZO), cadmium oxide, cadmium-tin oxide, titanium oxide, and zinc oxide; metal compounds such as copper iodide; metals such as gold (Au), silver (Ag), platinum (Pt), and palladium (Pd); and inorganic or organic nanomaterials such as silver nanowires and carbon nanotubes (CNTs). Among these, indium tin oxide, carbon nanotubes, and silver nanowires are preferred, and particularly preferred is indium tin oxide from a light transmittivity and durability perspective.

It is noted that when CNTs are used, any of single-walled CNTs, double-walled CNTs, triple- or higher order multi-walled CNTs may be used, yet the diameter of the CNTs used is preferably from 0.3 nm to 100 nm and the length thereof is preferably from 0.1 μm to 20 μm. It is noted that from the viewpoint of increasing transparency of conductive layers and reducing the surface resistance, single-walled CNTs or double-walled CNTs of 10 nm or less in diameter and 1 μm to 10 μm in length are preferably used. It is also preferred that the collection of CNTs contain as few impurities as possible, such as amorphous carbon and catalyst metal.

Additionally, the formation of the first conductive layer 61 on the surface of the substrate 50 is not particularly limited, and may be performed by a sputtering method, a vacuum evaporation method, a CVD method, an ion plating method, a sol-gel method, a coating method, or the like.

[Dielectric Layer (Insulating Layer)]

The dielectric layer 62 is formed on one surface (on the cover layer 70 side) of the first conductive layer 61. The dielectric layer 62, which is formed from a dielectric, is positioned between the first conductive layer 61 and the second conductive layer 63 such that an electrostatic capacity can be formed between the first conductive layer 61 and the second conductive layer 63.

Here, as the dielectric layer 62, any layer may be used that is formed by using a known dielectric, for example, an acrylic-based, polyimide-based, epoxy-based, polyester-based, polyurethane-based, or polystyrene-based material.

In addition, the formation of the dielectric layer 62 on the surface of the first conductive layer 61 may be performed by using a known method.

It is noted that no particular limitation is placed on the structure or material of the dielectric layer 62 as long as an electrostatic capacity can be formed between the first conductive layer 61 and the second conductive layer 63. Thus, the dielectric layer 62 may have a single- or multi-layer structure. In addition, the dielectric layer 62 may be formed solely from a single type of material or formed from more than one type of material.

[Second Conductive Layer]

The second conductive layer 63 is formed on one surface (on the cover layer 70 side) of the dielectric layer 62. Additionally, the second conductive layer 63 forms a capacitive touch sensor, in conjunction with the first conductive layer 61 positioned apart in the stacking direction across the dielectric layer 62.

Additionally, the second conductive layer 63 may be formed by using the same material as the first conductive layer 61.

In addition, the formation of the second conductive layer 63 on the surface of the dielectric layer 62 may be performed by using the same method as the first conductive layer 61.

Here, the conductive layers 61, 63 constituting the capacitive touch sensor are often formed in a patterned manner. Specifically, the first conductive layer 61 and the second conductive layer 63 may be formed in a pattern such that they form a rectilinear lattice, a wavy lattice, or a diamond-like lattice when arranged to face each other and viewed in the stacking direction. It is noted that the wavy lattice refers to a shape having at least one curved section between intersections.

Additionally, the patterned formation of the first conductive layer 61 and the second conductive layer 63 may be provided by, for example, forming on the surface of the substrate 50 a first electrode layer pattern made from ITO (first conductive layers 61), forming thereon dielectric layers 62, and forming on the dielectric layers 62 a second electrode layer pattern made from ITO (second conductive layers 63) so as to create a matrix with the first electrode layer pattern.

It is noted that the thickness of the first conductive layer 61 and of the second conductive layer 63, when formed from ITO, may be, for example, and without limitation, preferably from 10 nm to 150 nm, and more preferably from 15 nm to 70 nm. The surface resistivity of the first conductive layer 61 and of the second conductive layer 63 may be preferably, but is not particularly limited to, 100 Ω/sq to 1000 Ω/sq.

[Cover Layer]

The cover layer 70 may be formed by using a known member, for example, a plate that is made of glass or plastic and is transparent to visible light.

Additionally, with the display device with a capacitive touch panel 100, since the substrate 50 provided with the optical film 52 having a predetermined phase difference is arranged between the viewing-side polarizing plate 40 and the cover layer 70, it is possible to convert linearly polarized light traveling through the viewing-side polarizing plate 40 towards the cover layer 70 side into circularly polarized light or elliptically polarized light. Thus, the display device with a capacitive touch panel 100 enables the operator to visually recognize the displayed content on the display device through polarized sunglasses even under the condition of so-called crossed nicols, in which the transmission axis of the polarized sunglasses worn by the operator and the transmission axis of the polarizing film 42 of the viewing-side polarizing plate 40 are set orthogonal to each other In addition, in the display device with a capacitive touch panel 100, the first conductive layer 61, the dielectric layer 62, and the second conductive layer 63 are all formed on the substrate 50, there is no need to provide transparent base plates separately for forming the first and second conductive layers. Accordingly, it is possible to simplify the structure of the touch sensor and reduce the number of members present between the viewing-side polarizing plate 40 and the cover layer 70, thereby reducing the thickness between the liquid crystal panel as the display panel 20 and the cover layer 70. As a result, a reduction in thickness of the display device 100 can be achieved. It is noted that since a conductive layer is formed on only one surface of the substrate 50 in the display device 100, a conductive layer uniform in thickness can be formed easily as compared to the case where conductive layers are formed on both surfaces of the substrate 50.

Moreover, in the above example of the display device 100, the first conductive layer 61, dielectric layer 62, and second conductive layer 63 constituting the capacitive touch sensor are disposed between the viewing-side polarizing plate 40 and the cover layer 70. Accordingly, it is possible to maintain a sufficient distance, even in the device with a reduced thickness, between the liquid crystal panel as the display panel 20 and the first conductive layer 61, dielectric layer 62, and second conductive layer 63 constituting the touch sensor, as compared to the case where the first conductive layer 61, dielectric layer 62, and second conductive layer 63 are provided closer to the liquid crystal panel than is the viewing-side polarizing plate 40. Consequently, it is possible to suppress a decrease in sensitivity of the touch sensor caused by the influence of electrical noise from the display panel 20 side. In particular, in the display device 100, since the first conductive layer 61, dielectric layer 62, and second conductive layer 63 are formed closer to the cover layer 70 than is the substrate 50, it is possible to maintain a sufficient distance between the display panel 20 and the first conductive layer 61, dielectric layer 62, and second conductive layer 63 constituting the touch sensor, and to sufficiently suppress a decrease in sensitivity of the touch sensor caused by the influence of electrical noise from the display panel 20 side.

Display Device with Capacitive Touch Panel (First Variation of First Embodiment)

FIG. 1(b) schematically illustrates a cross-sectional structure of the main part of a variation of the aforementioned display device with a capacitive touch panel 100.

Here, the display device with a capacitive touch panel 100A illustrated in FIG. 1(b) differs from the example of the display device with a capacitive touch panel 100 as described previously in the following points:

the first conductive layer 61 is formed not on one surface (on the cover layer 70 side) of the substrate 50, but on the other surface (on the display panel 20 side) of the substrate 50;

the dielectric layer 62 is formed on a surface of the first conductive layer 61 on the display panel 20 side, and the second conductive layer 63 is formed on a surface of the dielectric layer 62 on the display panel 20 side; and the first conductive layer 61, the dielectric layer 62, and the second conductive layer 63 are positioned between the viewing-side polarizing plate 40 and the substrate 50.

The display device with a capacitive touch panel 100A has otherwise the same features as the display device with a capacitive touch panel 100.

Additionally, similar to the aforementioned example of the display device with a capacitive touch panel 100, the display device with a capacitive touch panel 100A enables the operator to visually recognize the displayed content even under the condition of so-called crossed nicols, in which the transmission axis of the polarized sunglasses worn by the operator and the transmission axis of the polarizing film 42 of the viewing-side polarizing plate 40 are set orthogonal to each other. It is also possible to simplify the structure of the touch sensor and reduce the thickness between the liquid crystal panel as the display panel 20 and the cover layer 70. Moreover, the display device 100A can also suppress a decrease in sensitivity of the touch sensor caused by the influence of electrical noise from the display panel 20 side, as compared to the case where the first conductive layer 61, dielectric layer 62, and second conductive layer 63 are formed closer to the display panel 20 than is the viewing-side polarizing plate 40. In addition, a conductive layer uniform in thickness can be formed easily as compared to the case where conductive layers are formed on both surfaces of the substrate 50.

Display Device with Capacitive Touch Panel
(Second Variation of First Embodiment)

FIG. 1(*c*) schematically illustrates a cross-sectional structure of the main part of another variation of the aforementioned display device with a capacitive touch panel 100.

Here, the display device with a capacitive touch panel 100B illustrated in FIG. 1(*c*) differs from the example of the display device with a capacitive touch panel 100 as described previously in the following points:

the viewing-side polarizing plate 40 does not have the cover layer-side protective film 43, and the polarizing film 42 is positioned at a surface (the upper surface in FIG. 1(*c*)) of the viewing-side polarizing plate 40 on the cover layer 70 side; and the substrate 50 is bonded to a surface, on the cover layer 70 side, of the polarizing film 42 of the viewing-side polarizing plate 40.

The display device with a capacitive touch panel 100B has otherwise the same features as the display device with a capacitive touch panel 100.

Here, the bonding of the substrate 50 on the polarizing film 42 may be performed by using a known adhesive layer or pressure sensitive adhesive layer.

Additionally, similar to the aforementioned example of the display device with a capacitive touch panel 100, the display device with a capacitive touch panel 100B enables the operator to visually recognize the displayed content even under the condition of so-called crossed nicols, in which the transmission axis of the polarized sunglasses worn by the operator and the transmission axis of the polarizing film 42 of the viewing-side polarizing plate 40 are set orthogonal to each other. It is also possible to simplify the structure of the touch sensor and reduce the thickness between the liquid crystal panel as the display panel 20 and the cover layer 70. Moreover, similar to the display device with a capacitive touch panel 100, the display device 100B allows for sufficiently suppressing a decrease in sensitivity of the touch sensor caused by the influence of electrical noise from the display panel 20 side. In addition, a conductive layer uniform in thickness can be formed easily as compared to the case where conductive layers are formed on both surfaces of the substrate 50.

It is noted that in the display device 100B, it is possible to cause the substrate 50 to function as a protective film for the polarizing film 42, which may thus make the cover layer-side protective film of the viewing-side polarizing plate 40 unnecessary, thereby reducing the thickness of the viewing-side polarizing plate 40. Accordingly, it is possible to further reduce the thickness between the display panel 20 and the cover layer 70.

Here, in the display device 100B, the optical film 52 and the polarizing film 42 may be bonded together by using, as the substrate 50, a substrate that does not have the hard coat layer 51 on the polarizing film 42 side of the optical film 52 (namely, a substrate having the optical film 52 positioned at a surface thereof on the display panel 20 side). If not only the cover layer-side protective film of the viewing-side polarizing plate 40, but also the hard coat layer 51 of the substrate 50 is no longer needed, the thickness between the display panel 20 and the cover layer 70 can be reduced even more.

Display Device with Capacitive Touch Panel
(Second Embodiment)

Figure 2:
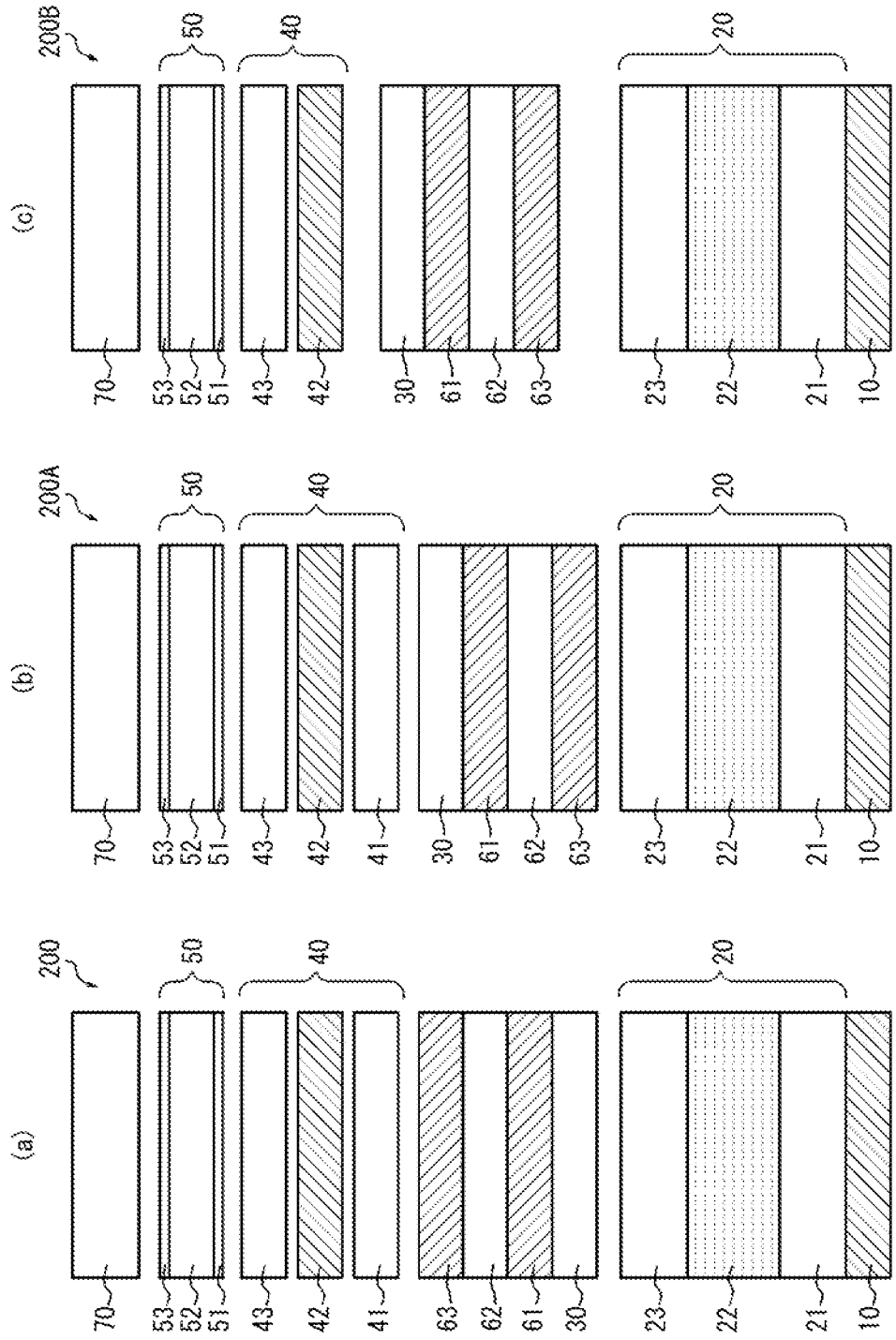
FIG. 2 contains cross-sectional views: (a) schematically illustrating a cross-sectional structure of the main part of a second display device with a capacitive touch panel according to the disclosure, and (b) and (c) each schematically illustrating a cross-sectional structure of the main part of a variation of the display device with a capacitive touch panel illustrated in FIG. 2(a)

FIG. 2(*a*) schematically illustrates a cross-sectional structure of the main part of a second display device with a capacitive touch panel according to the disclosure.

Here, the display device with a capacitive touch panel 200 illustrated in FIG. 2(*a*) differs from the example of the display device with a capacitive touch panel 100 as described previously in the following points:

the first conductive layer 61 is formed not on one surface (on the cover layer 70 side) of the substrate 50, but on one surface (on the cover layer 70 side) of an optical compensation substrate formed by the phase difference film 30 for optical compensation; and the first conductive layer 61, the dielectric layer 62 formed on a surface of the first conductive layer 61 on the cover layer 70 side, and the second conductive layer 63 formed on a surface of the dielectric layer 62 on the cover layer 70 side are positioned closer to the display panel 20 than is the viewing-side polarizing plate 40, specifically between the viewing-side polarizing plate 40 and the phase difference film 30 for optical compensation. The display device with a capacitive touch panel 200 has otherwise the same features as the display device with a capacitive touch panel 100.

It is noted that the second display device with a capacitive touch panel may not have the substrate 50. In addition, the optical compensation substrate may be a phase difference film having a hard coat layer or an optical functional layer formed on a surface thereof.

Here, the formation of the first conductive layer 61 on the optical compensation substrate formed by the phase difference film 30 may be performed by using the same method as used in the formation of the first conductive layer 61 in the display device with a capacitive touch panel 100.

Additionally, similar to the aforementioned example of the display device with a capacitive touch panel 100, the display device with a capacitive touch panel 200 has the substrate 50, and thus enables the operator to visually recognize the displayed content even under the condition of so-called crossed nicols, in which the transmission axis of the polarized sunglasses worn by the operator and the transmission axis of the polarizing film 42 of the viewing-side polarizing plate 40 are set orthogonal to each other. In addition, in the display device with a capacitive touch panel 200, the first conductive layer 61, the dielectric layer 62, and the second conductive layer 63 are all formed on the optical compensation substrate (phase difference film 30), there is no need to provide transparent base plates separately for forming the first and second conductive layers. Accordingly, it is possible to compensate, by the phase difference film 30, for viewing angle dependence of the liquid crystal panel as the display panel 20, a light leakage phenomenon occurring at the polarizing plate at the time of oblique angle viewing, and the like, simplify the structure of the touch sensor, and reduce the number of members present between the display panel 20 and the cover layer 70, thereby reducing the thickness between the display panel 20 and the cover layer 70. As a result, a reduction in thickness of the display device 200 can be achieved. It is noted that since a conductive layer is formed on only one surface of the optical compensation substrate (phase difference film 30) in the display device 200, a conductive layer uniform in thickness can be formed easily as compared to the case where conductive layers are formed on both surfaces of the optical compensation substrate (phase difference film 30).

It is noted that in the second display device with a capacitive touch panel according to the disclosure, it is possible to cause the substrate 50 to function as a protective film for the polarizing film 42, which may make the cover layer-side protective film of the viewing-side polarizing plate 40 unnecessary, thereby reducing the thickness of the viewing-side polarizing plate 40. That is, in the second display device with a capacitive touch panel, the polarizing film 42 may be positioned at a surface of the viewing-side polarizing plate 40 on the cover layer 70 side, and the substrate 50 may be bonded to a surface, on the cover layer 70 side, of the polarizing film 42 of the viewing-side polarizing plate 40, thereby further reducing the thickness between the display panel 20 and the cover layer 70.

Display Device with Capacitive Touch Panel (First Variation of Second Embodiment)

FIG. 2(b) schematically illustrates a cross-sectional structure of the main part of a variation of the aforementioned display device with a capacitive touch panel 200.

Here, the display device with a capacitive touch panel 200A illustrated in FIG. 2(b) differs from the example of the display device with a capacitive touch panel 200 as described previously in the following points:

the first conductive layer 61 is formed not on one surface (on the cover layer 70 side) of the phase difference film 30 for optical compensation (optical compensation substrate), but on the other surface (on the display panel 20 side) of the phase difference film 30;

the dielectric layer 62 is formed on a surface of the first conductive layer 61 on the display panel 20 side, and the second conductive layer 63 is formed on a surface of the dielectric layer 62 on the display panel 20 side; and the first conductive layer 61, the dielectric layer 62, and the second conductive layer 63 are positioned between the phase difference film 30 and the display panel 20.

The display device with a capacitive touch panel 200A has otherwise the same features as the display device with a capacitive touch panel 200.

Additionally, similar to the aforementioned example of the display device with a capacitive touch panel 200, the display device with a capacitive touch panel 200A enables the operator to visually recognize the displayed content even under the condition of so-called crossed nicols, in which the transmission axis of the polarized sunglasses worn by the operator and the transmission axis of the polarizing film 42 of the viewing-side polarizing plate 40 are set orthogonal to each other. In addition, it is possible to compensate, by the phase difference film 30, for viewing angle dependence of the liquid crystal panel as the display panel 20, a light leakage phenomenon occurring at the polarizing plate at the time of oblique angle viewing, and the like, and simplify the structure of the touch sensor, thereby reducing the thickness between the display panel 20 and the cover layer 70. Moreover, a conductive layer uniform in thickness can be formed easily as compared to the case where conductive layers are formed on both surfaces of the optical compensation substrate (phase difference film 30).

Display Device with Capacitive Touch Panel (Second Variation of Second Embodiment)

FIG. 2(c) schematically illustrates a cross-sectional structure of the main part of another variation of the aforementioned display device with a capacitive touch panel 200.

Here, the display device with a capacitive touch panel 200B illustrated in FIG. 2(c) differs from the example of the display device with a capacitive touch panel 200 as described previously in the following points:

the first conductive layer 61 is formed not on one surface (on the cover layer 70 side) of the phase difference film 30 for optical compensation (optical compensation substrate), but on the other surface (on the display panel 20 side) of the phase difference film 30;

the dielectric layer 62 is formed on a surface of the first conductive layer 61 on the display panel 20 side, and the second conductive layer 63 is formed on a surface of the dielectric layer 62 on the display panel 20 side;

the first conductive layer 61, the dielectric layer 62, and the second conductive layer 63 are positioned between the phase difference film 30 and the display panel 20;

the viewing-side polarizing plate 40 does not have the display panel-side protective film 41, and the polarizing film 42 is positioned at a surface (the lower surface in FIG. 2(c)) of the viewing-side polarizing plate 40 on the display panel 20 side; and the phase difference film 30 for optical compensation (optical compensation substrate) is bonded to a surface, on the display panel 20 side, of the polarizing film 42 of the viewing-side polarizing plate 40.

The display device with a capacitive touch panel 200B has otherwise the same features as the display device with a capacitive touch panel 200.

Here, the bonding of the phase difference film 30 (optical compensation substrate) on the polarizing film 42 may be performed by using a known adhesive layer or pressure sensitive adhesive layer.

Additionally, similar to the aforementioned example of the display device with a capacitive touch panel 200, the display device with a capacitive touch panel 200B enables the operator to visually recognize the displayed content even under the condition of so-called crossed nicols, in which the transmission axis of the polarized sunglasses worn by the operator and the transmission axis of the polarizing film 42 of the viewing-side polarizing plate 40 are set orthogonal to each other. In addition, it is possible to compensate, by the phase difference film 30, for viewing angle dependence of the liquid crystal panel as the display panel 20, a light leakage phenomenon occurring at the polarizing plate at the time of oblique angle viewing, and the like, and simplify the structure of the touch sensor, thereby reducing the thickness between the display panel 20 and the cover layer 70. Moreover, a conductive layer uniform in thickness can be formed easily as compared to the case where conductive layers are formed on both surfaces of the optical compensation substrate (phase difference film 30).

It is noted that in the display device 200B, it is possible to cause the phase difference film 30 (optical compensation substrate) to function as a protective film for the polarizing film 42, which may thus make the display panel-side protective film of the viewing-side polarizing plate 40 unnecessary, thereby reducing the thickness of the viewing-side polarizing plate 40. Accordingly, it is possible to further reduce the thickness between the display panel 20 and the cover layer 70.

Display Device with Capacitive Touch Panel (Third Embodiment)

Figure 3:
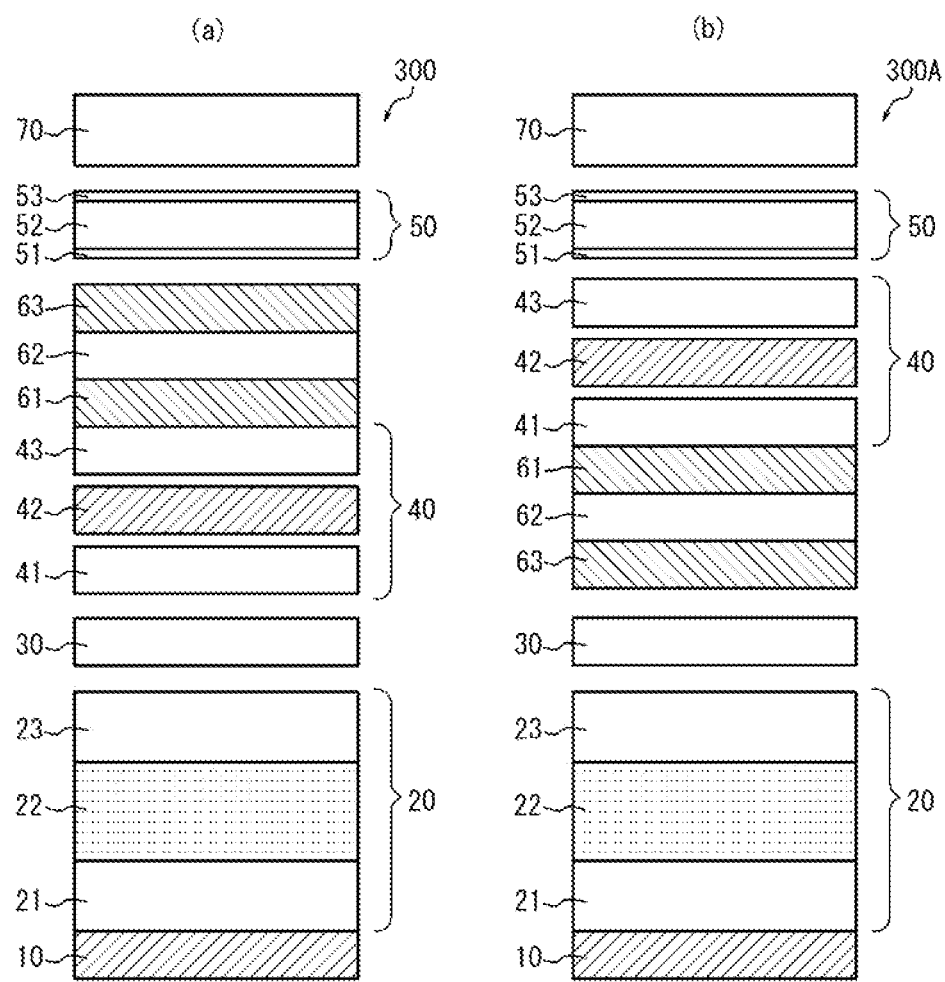
FIG. 3 contains cross-sectional views: (a) schematically illustrating a cross-sectional structure of the main part of a third display device with a capacitive touch panel according to the disclosure, and (b) schematically illustrating a cross-sectional structure of the main part of a variation of the display device with a capacitive touch panel illustrated in FIG. 3(a)

FIG. 3(*a*) schematically illustrates a cross-sectional structure of the main part of a third display device with a capacitive touch panel according to the disclosure.

Here, the display device with a capacitive touch panel 300 illustrated in FIG. 3(*a*) differs from the example of the display device with a capacitive touch panel 100 as described previously in the following points:

the first conductive layer 61 is formed not on one surface (on the cover layer 70 side) of the substrate 50, but on one surface (on the cover layer 70 side) of the viewing-side polarizing plate 40, specifically on a surface, on the cover layer 70 side, of the cover layer-side protective film 43 of the viewing-side polarizing plate 40; and the first conductive layer 61, the dielectric layer 62 formed on a surface of the first conductive layer 61 on the cover layer 70 side, and the second conductive layer 63 formed on a surface of the dielectric layer 62 on the cover layer 70 side are positioned between the viewing-side polarizing plate 40 and the substrate 50.

The display device with a capacitive touch panel 300 has otherwise the same features as the display device with a capacitive touch panel 100.

It is noted that the third display device with a capacitive touch panel may not have both of the substrate 50 with the optical film 52 and the phase difference film 30, or may have only one of the substrate 50 and the phase difference film 30.

Here, the formation of the first conductive layer 61 on the viewing-side polarizing plate 40 may be performed by using the same method as used in the formation of the first conductive layer 61 in the display device with a capacitive touch panel 100.

Additionally, similar to the aforementioned example of the display device with a capacitive touch panel 100, the display device with a capacitive touch panel 300 has the substrate 50, and thus enables the operator to visually recognize the displayed content even under the condition of so-called crossed nicols, in which the transmission axis of the polarized sunglasses worn by the operator and the transmission axis of the polarizing film 42 of the viewing-side polarizing plate 40 are set orthogonal to each other. In addition, in the display device with a capacitive touch panel 300, the first conductive layer 61, the dielectric layer 62, and the second conductive layer 63 are all formed on the viewing-side polarizing plate 40, there is no need to provide transparent base plates separately for forming the first and second conductive layers. Accordingly, it is possible to simplify the structure of the touch sensor and reduce the number of members present between the display panel 20 and the cover layer 70, thereby reducing the thickness between the liquid crystal panel as the display panel 20 and the cover layer 70. As a result, a reduction in thickness of the display device 300 can be achieved. It is noted that since a conductive layer is formed on only one surface of the viewing-side polarizing plate 40 in the display device 300, a conductive layer uniform in thickness can be formed easily as compared to the case where conductive layers are formed on both surfaces of the viewing-side polarizing plate 40.

Moreover, in the above example of the display device 300, the first conductive layer 61, dielectric layer 62, and second conductive layer 63 constituting the capacitive touch sensor are disposed between the viewing-side polarizing plate 40 and the cover layer 70. Accordingly, it is possible to maintain a sufficient distance, even in the device with a reduced thickness, between the liquid crystal panel and the first conductive layer 61, dielectric layer 62, and second conductive layer 63 constituting the touch sensor, as compared to the case where the first conductive layer 61, dielectric layer 62, and second conductive layer 63 are provided closer to the display panel 20 than is the viewing-side polarizing plate 40. Consequently, it is possible to suppress a decrease in sensitivity of the touch sensor caused by the influence of electrical noise from the display panel 20 side.

Display Device with Capacitive Touch Panel (First Variation of Third Embodiment)

FIG. 3(*b*) schematically illustrates a cross-sectional structure of the main part of a variation of the aforementioned display device with a capacitive touch panel 300.

Here, the display device with a capacitive touch panel 300A illustrated in FIG. 3(*b*) differs from the example of the display device with a capacitive touch panel 300 as described previously in the following points:

the first conductive layer 61 is formed not on one surface (on the cover layer 70 side) of the viewing-side polarizing plate 40, but on the other surface (on the display panel 20 side) of the viewing-side polarizing plate 40, specifically on a surface, on the display panel 20 side, of the display panel-side protective film 41 of the viewing-side polarizing plate 40;

the dielectric layer 62 is formed on a surface of the first conductive layer 61 on the display panel 20 side, and the second conductive layer 63 is formed on a surface of the dielectric layer 62 on the display panel 20 side; and the first conductive layer 61, the dielectric layer 62, and the second conductive layer 63 are positioned between the viewing-side polarizing plate 40 and the phase difference film 30.

The display device with a capacitive touch panel 300A has otherwise the same features as the display device with a capacitive touch panel 300.

Additionally, similar to the aforementioned example of the display device with a capacitive touch panel 300, the display device with a capacitive touch panel 300A enables the operator to visually recognize the displayed content even under the condition of so-called crossed nicols, in which the transmission axis of the polarized sunglasses worn by the operator and the transmission axis of the polarizing film 42 of the viewing-side polarizing plate 40 are set orthogonal to each other. It is also possible to simplify the structure of the touch sensor and reduce the thickness between the liquid crystal panel as the display panel 20 and the cover layer 70. Moreover, a conductive layer uniform in thickness can be formed easily as compared to the case where conductive layers are formed on both surfaces of the viewing-side polarizing plate 40.

Display Device with Capacitive Touch Panel (Forth Embodiment)

Figure 4:
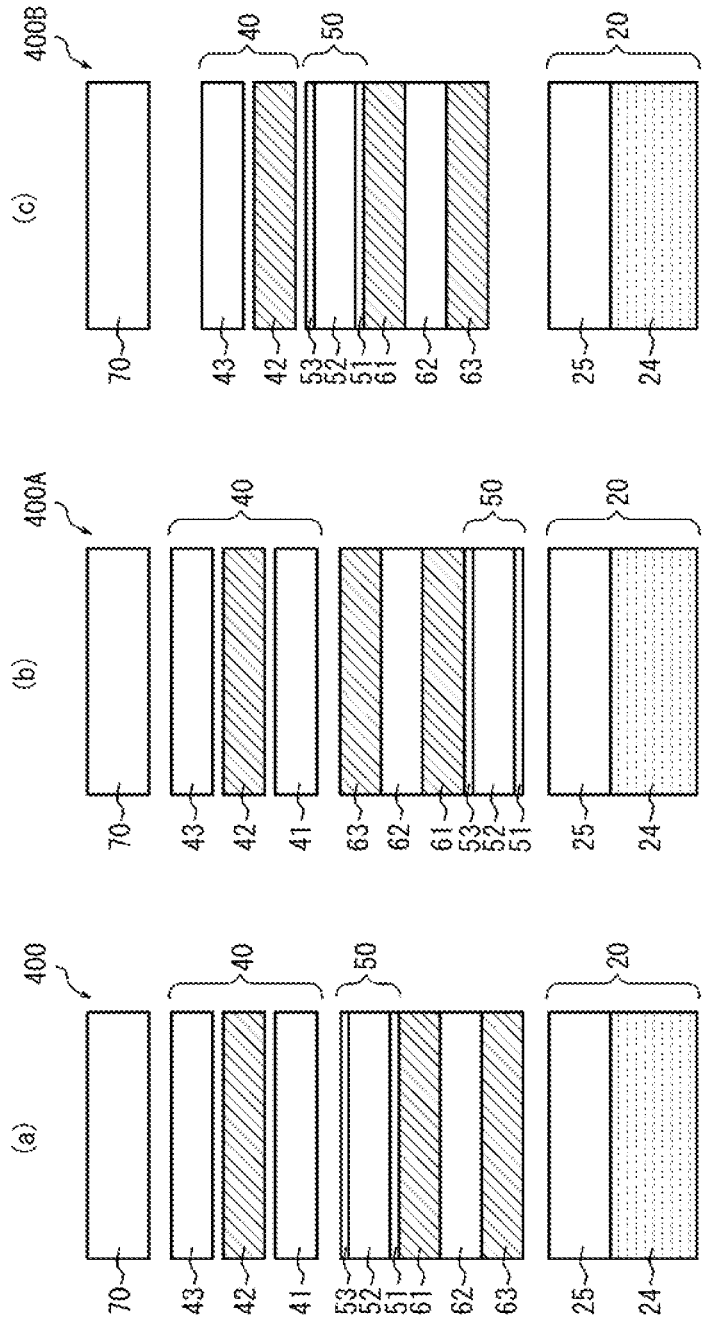
FIG. 4 contains cross-sectional views: (a) schematically illustrating a cross-sectional structure of the main part of a fourth display device with a capacitive touch panel according to the disclosure, and (b) and (c) each schematically illustrating a cross-sectional structure of the main part of a variation of the display device with a capacitive touch panel illustrated in FIG. 4(a)

FIG. 4(a) schematically illustrates a cross-sectional structure of the main part of a fourth display device with a capacitive touch panel according to the disclosure. It is noted here that the display device with a capacitive touch panel 400 illustrated in FIG. 4(a) is a device that has both a display function and a touch sensor function, the display function for displaying image information on the screen and the touch sensor function for detecting a position on the screen touched by the operator and outputting it as an information signal to the outside.

The display device with a capacitive touch panel 400 comprises the following members stacked in the stated order from the side on which the organic EL display (OLED) panel is arranged (the lower side of FIG. 4(a), and this side is hereinafter referred to simply as the "display panel side") towards the side from which the operator views an image (the upper side of FIG. 4(a), and this side is hereinafter referred to simply as the "viewing side"): an organic EL display (OLED) panel 24 and a barrier layer 25 as a display panel 20; a second conductive layer 63; a dielectric layer 62; a first conductive layer 61; a substrate 50; a polarizing plate 40; and a cover layer 70. Additionally, in the display device with a capacitive touch panel 400, the first conductive layer 61 is formed on one surface (on the display panel 20 side) of the substrate 50, the dielectric layer 62 is formed on a surface of the first conductive layer 61 opposite to the substrate 50 side (on the display panel 20 side), and the second conductive layer 63 is formed on a surface of the dielectric layer 62 opposite to the first conductive layer 61 side (on the display panel 20 side). In addition, in the display device 400, the polarizing plate 40 and the substrate 50 positioned closer to the display panel 20 than is the polarizing plate 40 constitute a circularly polarizing plate.

It is noted that the display panel 20, the substrate 50 formed with the first conductive layer 61, dielectric layer 62, and second conductive layer 63, the polarizing plate 40, and the cover layer 70 may be integrated into a single structure by bonding the members together using known means, such as providing adhesive layers or pressure sensitive adhesive layers, performing plasma treatment on the surfaces of members, and the like. That is, for example, adhesive layers or pressure sensitive adhesive layers are formed in gaps in the layered structure illustrated in FIG. 4(a).

[Organic EL Display (OLED) Panel]

As the organic EL display (OLED) panel 24, for example, an organic EL display (OLED) panel may be used that has, on a surface of a transparent base plate, a transparent electrode formed from a transparent electrode material, a light-emitting layer stacked on the transparent electrode and made from an EL material, and a back electrode stacked on the light-emitting layer and formed to face the transparent electrode, and that emits light on the transparent base plate side. Additionally, in the display device with a capacitive touch panel 400, the organic EL display (OLED) panel 24 is energized to present a desired image to the operator.

It is noted that any known material may be used as the transparent electrode, the light-emitting layer, and the back electrode. In addition, the display panel which may be used in the display device with a capacitive touch panel disclosed herein is not limited to the one using the organic EL display (OLED) panel 24 with the aforementioned structure.

[Barrier Layer]

The barrier layer 25 positioned on the viewing side of the organic EL display (OLED) panel 24 may be formed by using a known member, for example, a plate that is made of glass or plastic and is transparent to visible light.

[Second Conductive Layer]

The second conductive layer 63 is formed on one surface (on the display panel 20 side) of the dielectric layer 62. Additionally, the second conductive layer 63 forms a capacitive touch sensor, in conjunction with the first conductive layer 61 positioned apart in the stacking direction across the dielectric layer 62.

The second conductive layer 63 used in this case may be the same as that used in the display device with a capacitive touch panel 100. In addition, the formation of the second conductive layer 63 on the dielectric layer 62 may be performed by using the same method as the display device with a capacitive touch panel 100.

[Dielectric Layer (Insulating Layer)]

The dielectric layer 62 is formed on one surface (on the display panel 20 side) of the first conductive layer 61. The dielectric layer 62, which is formed from a dielectric, is positioned between the first conductive layer 61 and the second conductive layer 63 such that an electrostatic capacity can be formed between the first conductive layer 61 and the second conductive layer 63.

The dielectric layer 62 used in this case may be the same as that used in the display device with a capacitive touch panel 100. In addition, the formation of the dielectric layer 62 on the first conductive layer 61 may be performed by using the same method as the display device with a capacitive touch panel 100.

[First Conductive Layer]

The first conductive layer 61 is formed on one surface (on the display panel 20 side) of the substrate 50. Additionally, the first conductive layer 61 forms a capacitive touch sensor, in conjunction with the second conductive layer 63 positioned apart in the stacking direction across the dielectric layer 62.

The first conductive layer 61 used in this case may be the same as that used in the display device with a capacitive touch panel 100. In addition, the formation of the first conductive layer 61 on the substrate 50 may be performed by using the same method as the display device with a capacitive touch panel 100.

[Substrate with Optical Film]

The substrate 50 has the first conductive layer 61 formed on one surface thereof in the stacking direction (on the display panel 20 side in FIG. 4(a)), and comprises an optical film 52 with a phase difference of $\lambda/4$ and hard coat layers 51, 53 formed on both surfaces of the optical film 52. Additionally, the optical film 52 of the substrate 50 is arranged so that a slow axis of the optical film 52 and a transmission axis of a polarizing film 42 of the polarizing plate 40 as detailed below intersect at a predetermined angle as viewed in the stacking direction.

In this case, "a predetermined angle" refers to an angle at which a circularly polarizing plate can be formed by the polarizing plate 40 and the optical film 52, and it is possible to prevent reflected light of incident external light from making visual recognition of the displayed content difficult. Specifically, the predetermined angle is an angle at which linearly polarized light traveling from the cover layer 70 side through the polarizing plate 40 towards the display panel 20 side can be converted by the optical film 52 into circularly polarized light (for example, about 45°), and more specifically covers angles of 45°±5°, preferably 45°±3°, more preferably 45°±1°, and even more preferably 45°±0.3°.

In addition, the phrase "with a phase difference of λ/4" indicates that the phase difference (retardation Re) to be applied to light transmitted through the optical film 52 in the stacking direction is about ¼ times the wavelength λ of the light. Specifically, in the case where the transmitted light has a wavelength range from 400 nm to 700 nm, and when Re is about ¼ times the wavelength λ, it is meant that Re is in the range of λ/4±65 nm, preferably in the range of λ/4±30 nm, and more preferably in the range of λ/4±10 nm. It is noted that Re is the retardation in the in-plane direction represented by the equation Re=(nx−ny)×d, where nx is the refractive index in the film plane in the slow axis direction, ny is the refractive index in a direction orthogonal, in the film plane, to the slow axis in the film plane, and d is the thickness of the optical film 52.

[[Optical Film]]

The optical film 52 used in this case may be the same as that used in the display device with a capacitive touch panel 100.

It is noted that the optical film 52 forming part of the circularly polarizing plate in the display device 400 with a capacitive touch panel preferably has reverse wavelength dispersion characteristics such that the phase difference imparted to light incident on the optical film is wavelength dependent, namely, the phase difference becomes larger at long wavelength and smaller at short wavelength. In this way, the phase difference imparted to light incident on the optical film increases in absolute value with increasing wavelength of the light and decreases in absolute value with decreasing wavelength of the light, and therefore, desirable polarization characteristics can be obtained over a wide wavelength range and linearly polarized light can be converted into circularly polarized light.

[[Hard Coat Layer]]

The hard coat layers 51, 53 formed on both surfaces of the optical film 52 used in this case may be the same as those used in the display device with a capacitive touch panel 100.

As is the case with the display device with a capacitive touch panel 100, the substrate 50 may not have the hard coat layers 51, 53, or alternatively the substrate 50 may have an optical functional layer, such as an index matching layer and a low refractive index layer, instead of or in addition to the hard coat layers 51, 53.

[[Index Matching Layer]]

The index matching layer used in this case may be the same as that used in the display device with a capacitive touch panel 100.

It is noted that even if the difference in refractive index between the substrate 50 and the layer stacked directly on the substrate 50 (for example, a conductive layer, an adhesive layer, or a pressure sensitive adhesive layer) is 0.05 or more, an index matching layer may not be provided in the absence of the influence of interfacial reflection (for example, when the first conductive layer 61 is formed on the display panel 20 side of the substrate 50 forming the circularly polarizing plate).

[[Low Refractive Index Layer]]

The low refractive index layer used in this case may be the same as that used in the display device with a capacitive touch panel 100.

[Polarizing Plate]

The polarizing plate 40 used in this case is not particularly limited, and may be the same as the viewing-side polarizing plate used in the display device with a capacitive touch panel 100. A specific example of the polarizing plate 40 may be a polarizing plate 40 that is formed with the polarizing film 42 sandwiched between two protective films (display panel-side protective film 41 and cover layer-side protective film 43). Additionally, as mentioned above, the transmission axis of the polarizing film 42 and the slow axis of the optical film 52 of the substrate 50 are arranged to intersect at about 45 as viewed in the stacking direction (the vertical direction in FIG. 4(a)). It is noted that in the case of using the substrate 50 having an obliquely stretched film as the optical film 52 to produce a laminate including the polarizing plate 40 and the substrate 50 by a roll-to-roll process, it suffices to adjust the orientation angle of the obliquely stretched film used as the optical film 52 such that the slow axis of the optical film 52 and the transmission axis of the polarizing film 42 intersect at the aforementioned predetermined angle in the resulting laminate.

[Cover Layer]

The cover layer 70 may be formed by using a known member, for example, a plate that is made of glass or plastic and is transparent to visible light.

Additionally, in the display device with a capacitive touch panel 400, the circularly polarizing plate formed by the polarizing plate 40 and the substrate 50 is arranged between the cover layer 70 and the display panel 20, where the polarizing plate 40 has the polarizing film 42, and the substrate 50 has the optical film 52 with a predetermined phase difference and being arranged at a predetermined optical axis angle. This arrangement allows for preventing reflected light of incident external light from making visual recognition of the displayed content difficult. Specifically, linearly polarized light traveling from the cover layer 70 side through the polarizing plate 40 towards the display panel 20 side is converted into circularly polarized light by the optical film 52 of the substrate 50, and reverse circularly polarized light resulting from the circularly polarized light reflected at the display panel 20 is converted into another linearly polarized light orthogonal to the linearly polarized light by the optical film 52 of the substrate 50. In this way, it is possible to prevent, by the polarizing plate 40, transmission of said another linearly polarized light into the cover layer 70 side. Therefore, the display device with a capacitive touch panel 400 enables the operator to visually recognize the displayed content easily without interruption by reflected light.

In addition, in the display device with a capacitive touch panel 400, the first conductive layer 61, the dielectric layer 62, and the second conductive layer 63 are all formed on the substrate 50, there is no need to provide transparent base plates separately for forming the first and second conductive layers. Accordingly, it is possible to simplify the structure of the touch sensor and reduce the number of members present between the display panel 20 and the cover layer 70, thereby reducing the thickness between the display panel 20 and the cover layer 70. As a result, a reduction in thickness of the display device 400 can be achieved. It is noted that since a conductive layer is formed on only one surface of the substrate 50 in the display device 400, a conductive layer uniform in thickness can be formed easily as compared to the case where conductive layers are formed on both surfaces of the substrate 50.

In the display device with a capacitive touch panel 400, since the first conductive layer 61 is formed on the display panel 20 side of the substrate 50 constituting the circularly polarizing plate, an index matching layer may not be provided on the substrate 50.

Display Device with Capacitive Touch Panel (First Variation of Fourth Embodiment)

FIG. 4(b) schematically illustrates a cross-sectional structure of the main part of a variation of the aforementioned display device with a capacitive touch panel 400.

Here, the display device with a capacitive touch panel 400A illustrated in FIG. 4(b) differs from the example of the display device with a capacitive touch panel 400 as described previously in the following points:

the first conductive layer 61 is formed not on one surface (on the display panel 20 side) of the substrate 50, but on the other surface (on the cover layer 70 side) of the substrate 50;

the dielectric layer 62 is formed on a surface of the first conductive layer 61 on the cover layer 70 side, and the second conductive layer 63 is formed on a surface of the dielectric layer 62 on the cover layer 70 side; and the first conductive layer 61, the dielectric layer 62, and the second conductive layer 63 are positioned between the substrate 50 and the polarizing plate 40.

The display device with a capacitive touch panel 400A has otherwise the same features as the display device with a capacitive touch panel 400.

Additionally, similar to the aforementioned example of the display device with a capacitive touch panel 400, the display device with a capacitive touch panel 400A can prevent reflected light of incident external light from making visual recognition of the displayed content difficult. Therefore, the display device with a capacitive touch panel 400A enables the operator to visually recognize the displayed content easily without interruption by reflected light. It is also possible to simplify the structure of the touch sensor and reduce the thickness between the display panel 20 and the cover layer 70. Moreover, a conductive layer uniform in thickness can be formed easily as compared to the case where conductive layers are formed on both surfaces of the substrate 50.

Display Device with Capacitive Touch Panel (Second Variation of Fourth Embodiment)

FIG. 4(c) schematically illustrates a cross-sectional structure of the main part of another variation of the aforementioned display device with a capacitive touch panel 400.

Here, the display device with a capacitive touch panel 400B illustrated in FIG. 4(c) differs from the example of the display device with a capacitive touch panel 400 as described previously in the following points:

the polarizing plate 40 does not have the display panel-side protective film 41, and the polarizing film 42 is positioned at a surface (the lower surface in FIG. 4(c)) of the polarizing plate 40 on the display panel 20 side; and the substrate 50 is bonded to a surface, on the display panel 20 side, of the polarizing film 42 of the polarizing plate 40.

The display device with a capacitive touch panel 400B has otherwise the same features as the display device with a capacitive touch panel 400.

Here, the bonding of the substrate 50 on the polarizing film 42 may be performed by using a known adhesive layer or pressure sensitive adhesive layer.

Additionally, similar to the aforementioned example of the display device with a capacitive touch panel 400, the display device with a capacitive touch panel 400B can prevent reflected light of incident external light from making visual recognition of the displayed content difficult. Therefore, the display device with a capacitive touch panel 400B enables the operator to visually recognize the displayed content easily without interruption by reflected light. It is also possible to simplify the structure of the touch sensor and reduce the thickness between the display panel 20 and the cover layer 70. Moreover, a conductive layer uniform in thickness can be formed easily as compared to the case where conductive layers are formed on both surfaces of the substrate 50.

In addition, in the display device with a capacitive touch panel 400B, since the first conductive layer 61 is formed on the display panel 20 side of the substrate 50, an index matching layer may not be provided on the substrate 50, as is the case with the aforementioned example of the display device with a capacitive touch panel 400.

Moreover, in the display device 400B, it is possible to cause the substrate 50 to function as a protective film for the polarizing film 42, which may thus make the display panel-side protective film of the polarizing plate 40 unnecessary, thereby reducing the thickness of the polarizing plate 40. Accordingly, it is possible to further reduce the thickness between the display panel 20 and the cover layer 70.

Here, in the display device 400B, the optical film 52 and the polarizing film 42 may be bonded together by using, as the substrate 50, a substrate that does not have the hard coat layer 53 on the polarizing film 42 side of the optical film 52 (namely, a substrate having the optical film 52 positioned at a surface thereof on the cover layer 70 side). If not only the display panel-side protective film of the polarizing plate 40, but also the hard coat layer 53 of the substrate 50 is no longer needed, the thickness between the display panel 20 and the cover layer 70 can be reduced even more.

Display Device with Capacitive Touch Panel (Fifth Embodiment)

Figure 5:
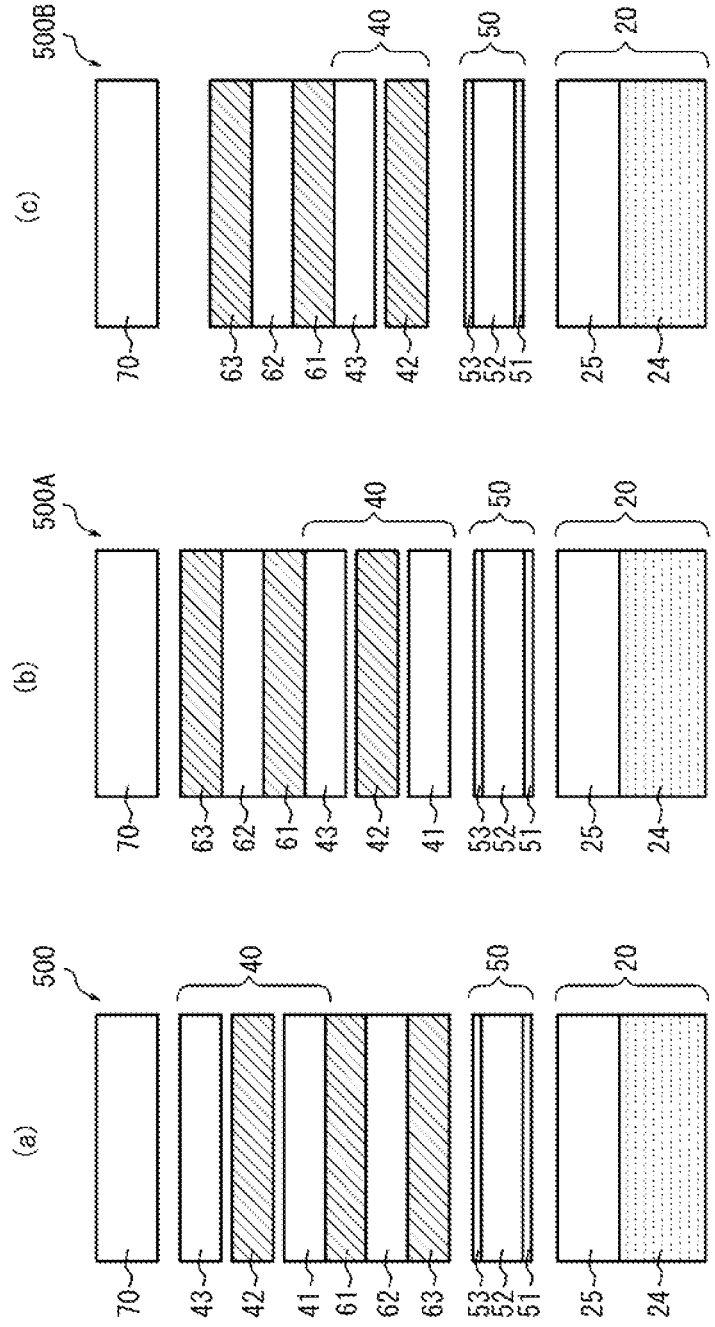
FIG. 5 contains cross-sectional views: (a) schematically illustrating a cross-sectional structure of the main part of a fifth display device with a capacitive touch panel according to the disclosure, and (b) and (c) each schematically illustrating a cross-sectional structure of the main part of a variation of the display device with a capacitive touch panel illustrated in FIG. 5(a)

FIG. 5(a) schematically illustrates a cross-sectional structure of the main part of a fifth display device with a capacitive touch panel according to the disclosure.

Here, the display device with a capacitive touch panel 500 illustrated in FIG. 5(a) differs from the example of the display device with a capacitive touch panel 400 as described previously in the following points:

the first conductive layer 61 is formed not on one surface (on the display panel 20 side) of the substrate 50, but on one surface (on the display panel 20 side) of the polarizing plate 40, specifically on a surface, on the display panel 20 side, of the display panel-side protective film 41 of the polarizing plate 40; and the first conductive layer 61, the dielectric layer 62 formed on a surface of the first conductive layer 61 on the display panel 20 side, and the second conductive layer 63 formed on a surface of the dielectric layer 62 on the display panel 20 side are positioned between the polarizing plate 40 and the substrate 50.

The display device with a capacitive touch panel 500 has otherwise the same features as the display device with a capacitive touch panel 400.

Here, the formation of the first conductive layer 61 on the polarizing plate 40 may be performed by using the same method as used in the formation of the first conductive layer 61 in the display device with a capacitive touch panel 400.

Additionally, similar to the aforementioned example of the display device with a capacitive touch panel 400, the display device with a capacitive touch panel 500 can prevent reflected light of incident external light from making visual recognition of the displayed content difficult. Therefore, the display device with a capacitive touch panel 500 enables the operator to visually recognize the displayed content easily without interruption by reflected light. In addition, in the display device with a capacitive touch panel 500, the first conductive layer 61, the dielectric layer 62, and the second conductive layer 63 are all formed on the polarizing plate 40, there is no need to provide transparent base plates separately for forming the first and second conductive layers. Accordingly, it is possible to simplify the structure of the touch sensor and reduce the number of members present between the display panel 20 and the cover layer 70, thereby reducing the thickness between the display panel 20 and the cover layer 70. As a result, a reduction in thickness of the display device 500 can be achieved. It is noted that since a conductive layer is formed on only one surface of the polarizing plate 40 in the display device 500, a conductive layer uniform in thickness can be formed easily as compared to the case where conductive layers are formed on both surfaces of the polarizing plate 40.

Display Device with Capacitive Touch Panel (First Variation of Fifth Embodiment)

FIG. 5(b) schematically illustrates a cross-sectional structure of the main part of a variation of the aforementioned display device with a capacitive touch panel 500.

Here, the display device with a capacitive touch panel 500A illustrated in FIG. 5(b) differs from the example of the display device with a capacitive touch panel 500 as described previously in the following points:
the first conductive layer 61 is formed not on one surface (on the display panel 20 side) of the polarizing plate 40, but on the other surface (on the cover layer 70 side) of the polarizing plate 40, specifically on a surface, on the cover layer 70 side, of the cover layer-side protective film 43 of the polarizing plate 40;
the dielectric layer 62 is formed on a surface of the first conductive layer 61 on the cover layer 70 side, and the second conductive layer 63 is formed on a surface of the dielectric layer 62 on the cover layer 70 side; and
the first conductive layer 61, the dielectric layer 62, and the second conductive layer 63 are positioned between the cover layer 70 and the polarizing plate 40.

The display device with a capacitive touch panel 500A has otherwise the same features as the display device with a capacitive touch panel 500.

Additionally, similar to the aforementioned example of the display device with a capacitive touch panel 500, the display device with a capacitive touch panel 500A can prevent reflected light of incident external light from making visual recognition of the displayed content difficult. Therefore, the display device with a capacitive touch panel 500A enables the operator to visually recognize the displayed content easily without interruption by reflected light. It is also possible to simplify the structure of the touch sensor and reduce the thickness between the display panel 20 and the cover layer 70. Moreover, a conductive layer uniform in thickness can be formed easily as compared to the case where conductive layers are formed on both surfaces of the polarizing plate 40.

Moreover, in the display device 500A, the first conductive layer 61, dielectric layer 62, and second conductive layer 63 constituting the capacitive touch sensor are disposed between the polarizing plate 40 and the cover layer 70. Accordingly, it is possible to maintain a sufficient distance, even in the device with a reduced thickness, between the display panel and the first conductive layer 61, dielectric layer 62, and second conductive layer 63 constituting the touch sensor, as compared to the case where the first conductive layer 61, dielectric layer 62, and second conductive layer 63 are provided closer to the display panel 20 than is the polarizing plate 40. Consequently, it is possible to suppress a decrease in sensitivity of the touch sensor caused by the influence of electrical noise from the display panel 20 side.

Display Device with Capacitive Touch Panel (Second Variation of Fifth Embodiment)

FIG. 5(c) schematically illustrates a cross-sectional structure of the main part of another variation of the aforementioned display device with a capacitive touch panel 500.

Here, the display device with a capacitive touch panel 500B illustrated in FIG. 5(c) differs from the example of the display device with a capacitive touch panel 500 as described previously in the following points:
the first conductive layer 61 is formed not on one surface (on the display panel 20 side) of the polarizing plate 40, but on the other surface (on the cover layer 70 side) of the polarizing plate 40, specifically on a surface, on the cover layer 70 side, of the cover layer-side protective film 43 of the polarizing plate 40;
the dielectric layer 62 is formed on a surface of the first conductive layer 61 on the cover layer 70 side, and the second conductive layer 63 is formed on a surface of the dielectric layer 62 on the cover layer 70 side;
the first conductive layer 61, the dielectric layer 62, and the second conductive layer 63 are positioned between the cover layer 70 and the polarizing plate 40;
the polarizing plate 40 does not have the display panel-side protective film 41, and the polarizing film 42 is positioned at a surface (the lower surface in FIG. 5(c)) of the polarizing plate 40 on the display panel 20 side; and
the substrate 50 is bonded to a surface, on the display panel 20 side, of the polarizing film 42 of the polarizing plate 40.

The display device with a capacitive touch panel 500B has otherwise the same features as the display device with a capacitive touch panel 500.

Here, the bonding of the substrate 50 on the polarizing film 42 may be performed by using a known adhesive layer or pressure sensitive adhesive layer.

Additionally, similar to the aforementioned example of the display device with a capacitive touch panel 500, the display device with a capacitive touch panel 500B can prevent reflected light of incident external light from making visual recognition of the displayed content difficult. Therefore, the display device with a capacitive touch panel 500B enables the operator to visually recognize the displayed content easily without interruption by reflected light. It is also possible to simplify the structure of the touch sensor and reduce the thickness between the display panel 20 and the cover layer 70. Moreover, a conductive layer uniform in thickness can be formed easily as compared to the case where conductive layers are formed on both surfaces of the polarizing plate 40.

Moreover, in the display device 500B, the first conductive layer 61, dielectric layer 62, and second conductive layer 63 constituting the capacitive touch sensor are disposed between the polarizing plate 40 and the cover layer 70. Accordingly, it is possible to maintain a sufficient distance, even in the device with a reduced thickness, between the display panel and the first conductive layer 61, dielectric layer 62, and second conductive layer 63 constituting the touch sensor, as compared to the case where the first conductive layer 61, dielectric layer 62, and second conductive layer 63 are provided closer to the display panel 20 than is the polarizing plate 40. Consequently, it is possible to suppress a decrease in sensitivity of the touch sensor caused by the influence of electrical noise from the display panel 20 side.

In addition, in the display device 500B, it is possible to cause the substrate 50 to function as a protective film for the polarizing film 42, which may thus make the display panel-side protective film of the polarizing plate 40 unnecessary, thereby reducing the thickness of the polarizing plate 40. Accordingly, it is possible to further reduce the thickness between the display panel 20 and the cover layer 70.

Here, in the display device 500B, the optical film 52 and the polarizing film 42 may be bonded together by using, as the substrate 50, a substrate that does not have the hard coat layer 53 on the polarizing film 42 side of the optical film 52 (namely, a substrate having the optical film 52 positioned at a surface thereof on the cover layer 70 side). If not only the display panel-side protective film of the polarizing plate 40, but also the hard coat layer 53 of the substrate 50 is no longer needed, the thickness between the display panel 20 and the cover layer 70 can be reduced even more.

Display Device with Capacitive Touch Panel (Sixth Embodiment)

Figure 6:
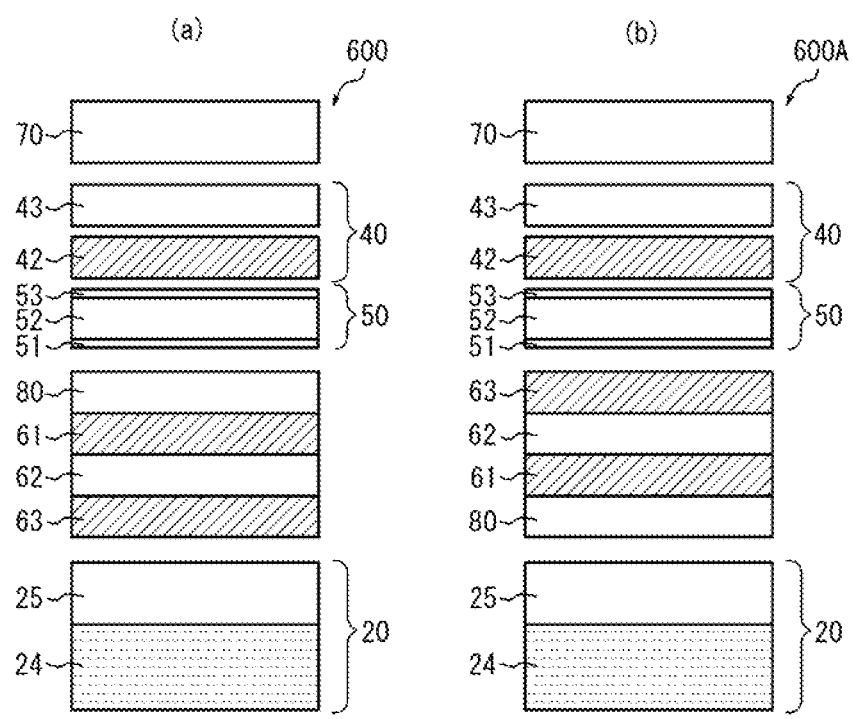
FIG. 6 contains cross-sectional views: (a) schematically illustrating a cross-sectional structure of the main part of a sixth display device with a capacitive touch panel according to the disclosure, and (b) schematically illustrating a cross-sectional structure of the main part of a variation of the display device with a capacitive touch panel illustrated in FIG. 6(a)

FIG. 6(a) schematically illustrates a cross-sectional structure of the main part of a sixth display device with a capacitive touch panel according to the disclosure.

Here, the display device with a capacitive touch panel 600 illustrated in FIG. 6(a) differs from the example of the display device with a capacitive touch panel 400 as described previously in the following points:

the polarizing plate 40 does not have the display panel-side protective film 41, and the polarizing film 42 is positioned at a surface (the lower surface in FIG. 6(a)) of the polarizing plate 40 on the display panel 20 side;
the substrate 50 is bonded to a surface, on the display panel 20 side, of the polarizing film 42 of the polarizing plate 40;
another substrate 80 is further provided between the substrate 50 and the display panel 20;
the first conductive layer 61 is formed not on one surface (on the display panel 20 side) of the substrate 50, but on one surface (on the display panel 20 side) of said another substrate 80; and
the first conductive layer 61, the dielectric layer 62 formed on a surface of the first conductive layer 61 on the display panel 20 side, and the second conductive layer 63 formed on a surface of the dielectric layer 62 on the display panel 20 side are positioned between said another substrate 80 and the display panel 20.

The display device with a capacitive touch panel 600 has otherwise the same features as the display device with a capacitive touch panel 400.

Here, the bonding of the substrate 50 on the polarizing film 42 may be performed by using a known adhesive layer or pressure sensitive adhesive layer.

[Another Substrate]

In addition, said another substrate 80 is not particularly limited, and may be a substrate that has a known optical film, a substrate that is transparent to visible light and does not cause any unnecessary phase difference, or the like. Additionally, the formation of the first conductive layer 61 on said another substrate 80 may be performed by using the same method as used in the formation of the first conductive layer 61 in the display device with a capacitive touch panel 400.

Additionally, similar to the aforementioned example of the display device with a capacitive touch panel 400, the display device with a capacitive touch panel 600 can prevent reflected light of incident external light from making visual recognition of the displayed content difficult. Therefore, the display device with a capacitive touch panel 600 enables the operator to visually recognize the displayed content easily without interruption by reflected light. In addition, in the display device with a capacitive touch panel 600, the first conductive layer 61, the dielectric layer 62, and the second conductive layer 63 are all formed on said another substrate 80, there is no need to provide transparent base plates separately for forming the first and second conductive layers. Accordingly, it is possible to simplify the structure of the touch sensor and reduce the number of members present between the display panel 20 and the cover layer 70, thereby reducing the thickness between the display panel 20 and the cover layer 70. As a result, a reduction in thickness of the display device 600 can be achieved. It is noted that since a conductive layer is formed on only one surface of said another substrate 80 in the display device 600, a conductive layer uniform in thickness can be formed easily as compared to the case where conductive layers are formed on both surfaces of said another substrate 80.

In addition, in the display device with a capacitive touch panel 600, since the first conductive layer 61 is formed on said another substrate 80 which is positioned closer to the display panel 20 than is the substrate 50 constituting the circularly polarizing plate, an index matching layer may not be provided on said another substrate 80 or the like, as is the case with the aforementioned example of the display device with a capacitive touch panel 400.

Moreover, in the display device 600, it is possible to cause the substrate 50 to function as a protective film for the polarizing film 42, which may thus make the display panel-side protective film of the polarizing plate 40 unnecessary, thereby reducing the thickness of the polarizing plate 40. Accordingly, it is possible to further reduce the thickness between the display panel 20 and the cover layer 70.

Here, in the display device 600, the optical film 52 and the polarizing film 42 may be bonded together by using, as the substrate 50, a substrate that does not have the hard coat layer 53 on the polarizing film 42 side of the optical film 52 (namely, a substrate having the optical film 52 positioned at a surface thereof on the cover layer 70 side). If not only the display panel-side protective film of the polarizing plate 40, but also the hard coat layer 53 of the substrate 50 is no longer needed, the thickness between the display panel 20 and the cover layer 70 can be reduced even more.

Display Device with Capacitive Touch Panel (First Variation of Sixth Embodiment)

FIG. 6(b) schematically illustrates a cross-sectional structure of the main part of a variation of the aforementioned display device with a capacitive touch panel 600.

Here, the display device with a capacitive touch panel 600A illustrated in FIG. 6(b) differs from the example of the display device with a capacitive touch panel 600 as described previously in the following points:

the first conductive layer 61 is formed not on one surface (on the display panel 20 side) of said another substrate 80, but on the other surface (on the cover layer 70 side) of said another substrate 80; and the dielectric layer 62 is formed on a surface of the first conductive layer 61 on the cover layer 70 side, and the second conductive layer 63 is formed on a surface of the dielectric layer 62 on the cover layer 70 side; and the first conductive layer 61, the dielectric layer 62, and the second conductive layer 63 are positioned between said another substrate 80 and the substrate 50.

The display device with a capacitive touch panel 600A has otherwise the same features as the display device with a capacitive touch panel 600.

Additionally, similar to the aforementioned example of the display device with a capacitive touch panel 600, the display device with a capacitive touch panel 600A can prevent reflected light of incident external light from making visual recognition of the displayed content difficult. Therefore, the display device with a capacitive touch panel 600A enables the operator to visually recognize the displayed content easily without interruption by reflected light. It is also possible to simplify the structure of the touch sensor and reduce the thickness between the display panel 20 and the cover layer 70. Moreover, a conductive layer uniform in thickness can be formed easily as compared to the case where conductive layers are formed on both surfaces of said another substrate 80.

In addition, in the display device with a capacitive touch panel 600A, since the first conductive layer 61 is formed on said another substrate 80 which is positioned closer to the display panel 20 than is the substrate 50, an index matching layer may not be provided on said another substrate 80 or the like, as is the case with the aforementioned example of the display device with a capacitive touch panel 600.

Moreover, similar to the aforementioned example of the display device with a capacitive touch panel 600, the display device 600A can eliminate the need for the display panel-side protective film of the polarizing plate 40 to reduce the thickness of the polarizing plate 40. Accordingly, it is possible to further reduce the thickness between the display panel 20 and the cover layer 70.

Here, in the display device 600A, a substrate that does not have the hard coat layer 53 on the polarizing film 42 side of the optical film 52 may be used as the substrate 50 to further reduce the thickness between the display panel 20 and the cover layer 70, as is the case with the aforementioned example of the display device with a capacitive touch panel 600.

Display Device with Capacitive Touch Panel (Seventh Embodiment)

FIG. 7(a) schematically illustrates a cross-sectional structure of the main part of a seventh display device with a capacitive touch panel according to the disclosure.

Here, the display device with a capacitive touch panel 700 illustrated in FIG. 7(a) differs from the example of the display device with a capacitive touch panel 400 as described previously in the following points:

the polarizing plate 40 does not have the display panel-side protective film 41, and the polarizing film 42 is positioned at a surface (the lower surface in FIG. 7(a)) of the polarizing plate 40 on the display panel 20 side;

the display device 700 further comprises a polarizing plate-side substrate 90 between the substrate 50 and the polarizing plate 40, more specifically between the substrate 50 and the polarizing film 42 of the polarizing plate 40, and the substrate 50, the polarizing plate-side substrate 90, and the polarizing plate 40 form a circularly polarizing plate;

the polarizing plate-side substrate 90 is bonded to a surface, on the display panel 20 side, of the polarizing film 42 of the polarizing plate 40;

the polarizing plate-side substrate 90 has another optical film 92 with a phase difference of $\lambda/2$; and the slow axis of the optical film 52, a slow axis of said another optical film 92, and the transmission axis of the polarizing film 42 intersect at a predetermined angle.

The display device with a capacitive touch panel 700 has otherwise the same features as the display device with a capacitive touch panel 400.

Here, the bonding of the polarizing plate-side substrate 90 on the polarizing film 42 may be performed by using a known adhesive layer or pressure sensitive adhesive layer.

[Polarizing Plate-side Substrate]

The polarizing plate-side substrate 90 has said another optical film 92 with a phase difference of $\lambda/2$ and hard coat layers 91, 93 formed on both surfaces of the optical film 92. Additionally, said another optical film 92 can be produced by using the same material and method as those used for the optical film 52, except that the phase difference to be imparted to light is set to $\lambda/2$. It is noted that in the display device with a capacitive touch panel according to the disclosure, the polarizing plate-side substrate 90 may not have the hard coat layers 91, 93. In addition, similar to the substrate 50, the polarizing plate-side substrate 90 may have an optical functional layer, such as an index matching layer and a low refractive index layer, instead of or in addition to the hard coat layers 91, 93.

As used herein, the phrase "with a phase difference of $\lambda/2$" indicates that the phase difference (retardation Re) to be applied to light transmitted through said another optical film 92 of the polarizing plate-side substrate 90 in the stacking direction is about one-half of the wavelength $\lambda$ of the light. Specifically, in the case where the transmitted light has a wavelength range from 400 nm to 700 nm, and when Re is about one-half of the wavelength $\lambda$, it is meant that Re is in the range of $\lambda/2 \pm 65$ nm, preferably in the range of $\lambda/2 \pm 30$ nm, and more preferably in the range of $\lambda/2 \pm 10$ nm. It is noted that Re is the retardation in the in-plane direction represented by the equation $Re=(nx-ny) \times d$, where nx is the refractive index in the film plane in the slow axis direction, ny is the refractive index in a direction orthogonal, in the film plane, to the slow axis in the film plane, and d is the thickness of said another optical film 92.

In addition, the optical film 52 of the substrate 50 and said another optical film 92 of the polarizing plate-side substrate 90 are used in combination to provide an optical plate that imparts a phase difference of λ/4 (a so-called wideband quarter wavelength plate), and are preferably formed from the same material having the same wavelength dispersion characteristics. Moreover, the optical film 52 and said another optical film 92 are arranged so that the slow axis of the optical film 52 intersects the transmission axis of the polarizing film 42 of the polarizing plate 40, and the slow axis of said another optical film 92 of the polarizing plate-side substrate 90 intersects the transmission axis of the polarizing film 42 of the polarizing plate 40, at predetermined angles, respectively, as viewed in the stacking direction.

In this case, "predetermined angles" represent angles at which a wideband quarter wavelength plate can be formed, specifically angles at which linearly polarized light A traveling from the cover layer 80 side through the polarizing plate 40 towards the display panel 20 side is converted into circularly polarized light A after passing through said another optical film 92 and the optical film 52 sequentially, and reverse circularly polarized light B resulting from the circularly polarized light A reflected at the display panel 20 is converted into another linearly polarized light B orthogonal to the linearly polarized light A after passing through the optical film 52 and said another optical film 92 sequentially.

Specifically, if it is now assumed that said another optical film 92 and the optical film 52 have the same wavelength dispersion characteristics, and that X° is an angle at which the slow axis of the optical film 52 intersects the transmission axis of the polarizing film 42, and Y° is an angle at which the slow axis of said another optical film 92 of the polarizing plate-side substrate 90 intersects the transmission axis of the polarizing film 42, "predetermined angles" represent angles at which the following equation holds: X−2Y=45°. More specifically, for example, possible combinations of "predetermined angles" include: (i) about 75° at which the slow axis of the optical film 52 intersects the transmission axis of the polarizing film 42 and about 15° at which the slow axis of said another optical film 92 of the polarizing plate-side substrate 90 intersects the transmission axis of the polarizing film 42, and (ii) about 90° at which the slow axis of the optical film 52 intersects the transmission axis of the polarizing film 42 and about 22.5° at which the slow axis of said another optical film 92 of the polarizing plate-side substrate 90 intersects the transmission axis of the polarizing film 42.

As used herein, "about 75°" more specifically covers angles of 75°±5° preferably 75°±3°, more preferably 75°±1°, and even more preferably 75°±0.30, "about 15°" more specifically covers angles of 15°±5°, preferably 15°±3°, more preferably 15°±1°, and even more preferably 15°±0.3°, "about 90°" more specifically covers angles of 90°±5°, preferably 90°±3°, more preferably 90°±1°, and even more preferably 90°±0.3°, and "about 22.5°" more specifically covers angles of 22.5°±5°, preferably 22.5°±3°, more preferably 22.5°±1°, and even more preferably 22.5°±0.3°.

It is noted that in view of the fact that the laminate including the polarizing plate 40 can be produced easily by a roll-to-roll process, the optical film 52 is preferably a vertical stretched film when forming an intersection angle of about 90° with the transmission axis of the polarizing film 42, or the optical film 52 is preferably an obliquely stretched film when forming an intersection angle of about 75° with the transmission axis of the polarizing film 42, and said another optical film 92 is preferably an obliquely stretched film when forming an intersection angle of about 15° with the transmission axis of the polarizing film 42, or said another optical film 92 is preferably an obliquely stretched film when forming an intersection angle of about 22.5° with the transmission axis of the polarizing film 42.

Additionally, in the display device with a capacitive touch panel 700, the circularly polarizing plate formed by the polarizing plate 40, the polarizing plate-side substrate 90, and the substrate 50 is arranged between the cover layer 70 and the display panel 20, where the polarizing plate 40 has the polarizing film 42, the polarizing plate-side substrate 90 has said another optical film 92 with a predetermined phase difference and being arranged at a predetermined optical axis angle, and the substrate 50 has the optical film 52 with a predetermined phase difference and being arranged at a predetermined optical axis angle. This arrangement allows for preventing reflected light of incident external light from making visual recognition of the displayed content difficult. Specifically, linearly polarized light traveling from the cover layer 70 side through the polarizing plate 40 towards the display panel 20 side is converted into circularly polarized light by the wideband quarter wavelength plate formed by said another optical film 92 of the polarizing plate-side substrate 90 and the optical film 52 of the substrate 50, and reverse circularly polarized light resulting from the circularly polarized light reflected at the display panel 20 is converted into another linearly polarized light orthogonal to the linearly polarized light by the wideband quarter wavelength plate (said another optical film 92 of the polarizing plate-side substrate 90 and the optical film 52 of the substrate 50). In this way, it is possible to prevent, by the polarizing plate 40, transmission of said another linearly polarized light into the cover layer 70 side. Therefore, the display device with a capacitive touch panel 700 enables the operator to visually recognize the displayed content easily without interruption by reflected light.

In addition, in the display device with a capacitive touch panel 700, the first conductive layer 61, the dielectric layer 62, and the second conductive layer 63 are all formed on the substrate 50 as the conductive-layer base member, there is no need to provide transparent base plates separately for forming the first and second conductive layers. Accordingly, it is possible to simplify the structure of the touch sensor and reduce the number of members present between the display panel 20 and the cover layer 70, thereby reducing the thickness between the display panel 20 and the cover layer 70. As a result, a reduction in thickness of the display device 700 can be achieved. It is noted that since a conductive layer is formed on only one surface of the substrate 50 as the conductive-layer base member in the display device 700, a conductive layer uniform in thickness can be formed easily as compared to the case where conductive layers are formed on both surfaces of the substrate 50.

In the display device with a capacitive touch panel 700, since the first conductive layer 61 is formed on the display panel 20 side of the substrate 50 constituting the circularly polarizing plate, an index matching layer may not be provided on the substrate 50.

Moreover, in the display device 700, it is possible to cause the polarizing plate-side substrate 90 to function as a protective film for the polarizing film 42, which may thus make the display panel-side protective film of the polarizing plate 40 unnecessary, thereby reducing the thickness of the polarizing plate 40. Accordingly, it is possible to further reduce the thickness between the display panel 20 and the cover layer 70.

Here, in the display device 700, said another optical film 92 and the polarizing film 42 may be bonded together by using, as the polarizing plate-side substrate 90, a substrate that does not have the hard coat layer 93 on the polarizing film 42 side of said another optical film 92 (namely, a substrate having said another optical film 92 positioned at a surface thereof on the cover layer 70 side). If not only the display panel-side protective film of the polarizing plate 40, but also the hard coat layer 93 of the polarizing plate-side substrate 90 is no longer needed, the thickness between the display panel 20 and the cover layer 70 can be reduced even more.

Display Device with Capacitive Touch Panel (First Variation of Seventh Embodiment)

FIG. 7(*b*) schematically illustrates a cross-sectional structure of the main part of a variation of the aforementioned display device with a capacitive touch panel 700.

Here, the display device with a capacitive touch panel 700A illustrated in FIG. 7(*b*) differs from the example of the display device with a capacitive touch panel 700 as described previously in the following points:

the first conductive layer 61 is formed not on one surface (on the display panel 20 side) of the substrate 50 as the conductive-layer base member, but on the other surface (on the cover layer 70 side) of the substrate 50 as the conductive-layer base member;

the dielectric layer 62 is formed on a surface of the first conductive layer 61 on the cover layer 70 side, and the second conductive layer 63 is formed on a surface of the dielectric layer 62 on the cover layer 70 side; and the first conductive layer 61, the dielectric layer 62, and the second conductive layer 63 are positioned between the substrate 50 and the polarizing plate-side substrate 90.

The display device with a capacitive touch panel 700A has otherwise the same features as the display device with a capacitive touch panel 700.

Additionally, similar to the aforementioned example of the display device with a capacitive touch panel 700, the display device with a capacitive touch panel 700A can prevent reflected light of incident external light from making visual recognition of the displayed content difficult. Therefore, the display device with a capacitive touch panel 700A enables the operator to visually recognize the displayed content easily without interruption by reflected light. It is also possible to simplify the structure of the touch sensor and reduce the thickness between the display panel 20 and the cover layer 70. Moreover, a conductive layer uniform in thickness can be formed easily as compared to the case where conductive layers are formed on both surfaces of the substrate 50 as the conductive-layer base member.

In addition, in the display device with a capacitive touch panel 700A, an index matching layer may not be provided on the substrate 50 or the like, as is the case with the aforementioned example of the display device with a capacitive touch panel 700.

Moreover, similar to the aforementioned example of the display device with a capacitive touch panel 700, the display device 700A can eliminate the need for the display panel-side protective film of the polarizing plate 40 to reduce the thickness of the polarizing plate 40.

Display Device with Capacitive Touch Panel (Second Variation of Seventh Embodiment)

FIG. 7(*c*) schematically illustrates a cross-sectional structure of the main part of another variation of the aforementioned display device with a capacitive touch panel 700.

Here, the display device with a capacitive touch panel 700B illustrated in FIG. 7(*c*) differs from the example of the display device with a capacitive touch panel 700 as described previously in the following points:

the conductive-layer base member is not the substrate 50 but the polarizing plate-side substrate 90, and the first conductive layer 61 is formed on one surface (on the display panel 20 side) of the polarizing plate-side substrate 90 as the conductive-layer base member;

the dielectric layer 62 is formed on a surface of the first conductive layer 61 on the display panel 20 side, and the second conductive layer 63 is formed on a surface of the dielectric layer 62 on the display panel 20 side; and the first conductive layer 61, the dielectric layer 62, and the second conductive layer 63 are positioned between the substrate 50 and the polarizing plate-side substrate 90 as the conductive-layer base member.

The display device with a capacitive touch panel 700B has otherwise the same features as the display device with a capacitive touch panel 700.

Here, the formation of the first conductive layer 61 on the polarizing plate-side substrate 90 may be performed by using the same method as used in the formation of the first conductive layer 61 in the display device with a capacitive touch panel 400.

Additionally, similar to the aforementioned example of the display device with a capacitive touch panel 700, the display device with a capacitive touch panel 700B can prevent reflected light of incident external light from making visual recognition of the displayed content difficult. Therefore, the display device with a capacitive touch panel 700B enables the operator to visually recognize the displayed content easily without interruption by reflected light. It is also possible to simplify the structure of the touch sensor and reduce the thickness between the display panel 20 and the cover layer 70. It is noted that since a conductive layer is formed on only one surface of the polarizing plate-side substrate 90 as the conductive-layer base member in the display device 700B, a conductive layer uniform in thickness can be formed easily as compared to the case where conductive layers are formed on both surfaces of the polarizing plate-side substrate 90.

In addition, in the display device with a capacitive touch panel 700B, since the first conductive layer 61 is formed on the display panel 20 side of the polarizing plate-side substrate 90, an index matching layer may not be provided on the polarizing plate-side substrate 90 or the like.

Moreover, similar to the aforementioned example of the display device with a capacitive touch panel 700, the display device 700B can eliminate the need for the display panel-side protective film of the polarizing plate 40 to reduce the thickness of the polarizing plate 40.

Display Device with Capacitive Touch Panel (Third Variation of Seventh Embodiment)

FIG. 7(*d*) schematically illustrates a cross-sectional structure of the main part of another variation of the aforementioned display device with a capacitive touch panel 700.

Here, the display device with a capacitive touch panel 700C illustrated in FIG. 7(*d*) differs from the example of the display device with a capacitive touch panel 700 as described previously in the following points:

the conductive-layer base member is not the substrate 50 but the polarizing plate 40, and the first conductive layer 61 is formed on a surface, on the cover layer 70 side, of the polarizing plate 40 as the conductive-layer base member, specifically on a surface, on the cover layer 70 side, of the cover layer-side protective film 43 of the polarizing plate 40;

the dielectric layer 62 is formed on a surface of the first conductive layer 61 on the cover layer 70 side, and the second conductive layer 63 is formed on a surface of the dielectric layer 62 on the cover layer 70 side; and the first conductive layer 61, the dielectric layer 62, and the second conductive layer 63 are positioned between the cover layer 70 and the polarizing plate 40 as the conductive-layer base member.

The display device with a capacitive touch panel 700C has otherwise the same features as the display device with a capacitive touch panel 700.

Here, the formation of the first conductive layer 61 on the polarizing plate 40 may be performed by using the same method as used in the formation of the first conductive layer 61 in the display device with a capacitive touch panel 400.

Additionally, similar to the aforementioned example of the display device with a capacitive touch panel 700, the display device with a capacitive touch panel 700C can prevent reflected light of incident external light from making visual recognition of the displayed content difficult. Therefore, the display device with a capacitive touch panel 700C enables the operator to visually recognize the displayed content easily without interruption by reflected light. It is also possible to simplify the structure of the touch sensor and reduce the thickness between the display panel 20 and the cover layer 70. It is noted that since a conductive layer is formed on only one surface of the polarizing plate 40 as the conductive-layer base member in the display device 700C, a conductive layer uniform in thickness can be formed easily as compared to the case where conductive layers are formed on both surfaces of the polarizing plate 40.

Moreover, similar to the aforementioned example of the display device with a capacitive touch panel 700, the display device 700C can eliminate the need for the display panel-side protective film of the polarizing plate 40 to reduce the thickness of the polarizing plate 40.

Moreover, in the display device 700C, the first conductive layer 61, dielectric layer 62, and second conductive layer 63 constituting the capacitive touch sensor are disposed closer to the cover layer 70 than is the polarizing plate 40, specifically between the polarizing plate 40 and the cover layer 70. Accordingly, it is possible to maintain a sufficient distance, even in the device with a reduced thickness, between the display panel and the first conductive layer 61, dielectric layer 62, and second conductive layer 63 constituting the touch sensor, as compared to the case where the first conductive layer 61, dielectric layer 62, and second conductive layer 63 are provided closer to the display panel 20 than is the polarizing plate 40. Consequently, it is possible to suppress a decrease in sensitivity of the touch sensor caused by the influence of electrical noise from the display panel 20 side.

While examples of the display device with a capacitive touch panel according to the disclosure have been described above, the display device with a capacitive touch panel according to the disclosure is not limited to the above examples, but is capable of modifications as deemed appropriate.

INDUSTRIAL APPLICABILITY

According to the disclosure, it is possible to provide a display device with a capacitive touch panel that is reduced in thickness.

According to the disclosure, it is also possible to provide a display device with a capacitive touch panel that can be operated by the operator even through polarized sunglasses and is reduced in thickness.

Moreover, according to the disclosure, it is possible to provide a display device with a capacitive touch panel that can prevent reflected light of incident external light from making visual recognition of the displayed content difficult, and that is reduced in thickness.

REFERENCE SIGNS LIST

10 Backlight-side polarizing plate
20 Display panel
21 Thin film transistor base plate
22 Liquid crystal layer
23 Color filter base plate
24 Organic EL display (OLED) panel
25 Barrier layer
30 Phase difference film
40 Viewing-side polarizing plate, Polarizing plate
41 Display panel-side protective film
42 Polarizing film
43 Cover layer-side protective film
50 Substrate
51, 53 Hard coat layer
52 Optical film
61 First conductive layer
62 Dielectric layer
63 Second conductive layer
70 Cover layer
80 Another substrate
90 Polarizing plate-side substrate
91, 93 Hard coat layer
92 Another optical film
100, 100A, 100B Display device with a capacitive touch panel
200, 200A, 200B Display device with a capacitive touch panel
300, 300A Display device with a capacitive touch panel
400, 400A, 400B Display device with a capacitive touch panel
500, 500A, 500B Display device with a capacitive touch panel
600, 600A Display device with a capacitive touch panel
700, 700A, 700B, 700C Display device with a capacitive touch panel

The invention claimed is:

1. A display device with a capacitive touch panel comprising a laminate between a display panel and a cover layer, the laminate having a viewing-side polarizing plate, a first conductive layer, a dielectric layer, and a second conductive layer, the first conductive layer, the dielectric layer, and the second conductive layer constituting a capacitive touch sensor, wherein
the first conductive layer is formed on one surface of the viewing-side polarizing plate,
the dielectric layer is formed on a surface of the first conductive layer opposite to the viewing-side polarizing plate, and
the second conductive layer is formed on a surface of the dielectric layer opposite to the first conductive layer.

2. The display device with a capacitive touch panel according to claim 1, wherein the display panel is a liquid crystal panel.

3. The display device with a capacitive touch panel according to claim 1, wherein the first conductive layer and the second conductive layer are formed by using indium tin oxide, carbon nanotubes, or silver nanowires.

* * * * *